US012701834B2

(12) United States Patent
Sun et al.

(10) Patent No.: US 12,701,834 B2
(45) Date of Patent: Aug. 4, 2026

(54) DISPLAY SUBSTRATE, DISPLAY PANEL, DISPLAY APPARATUS, AND METHOD OF FABRICATING DISPLAY SUBSTRATE

(71) Applicant: BOE Technology Group Co., Ltd., Beijing (CN)

(72) Inventors: Zhongyuan Sun, Beijing (CN); Jinxiang Xue, Beijing (CN); Wei Li, Beijing (CN); Che An, Beijing (CN); Fengjie Zhang, Beijing (CN); Zhiqiang Jiao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 417 days.

(21) Appl. No.: 18/264,481

(22) PCT Filed: Nov. 2, 2022

(86) PCT No.: PCT/CN2022/129195
§ 371 (c)(1),
(2) Date: Aug. 7, 2023

(87) PCT Pub. No.: WO2024/092548
PCT Pub. Date: May 10, 2024

(65) Prior Publication Data
US 2024/0145644 A1 May 2, 2024

(51) Int. Cl.
*H10H 20/853* (2025.01)
*H10H 20/01* (2025.01)
(Continued)

(52) U.S. Cl.
CPC ...... *H10H 20/853* (2025.01); *H10H 20/8514* (2025.01); *H10W 90/00* (2026.01); *H10H 20/0361* (2025.01); *H10H 20/0362* (2025.01)

(58) Field of Classification Search
CPC ............. H10H 20/853; H10H 20/8514; H10H 20/0362; H10H 20/0361; H01L 25/167
See application file for complete search history.

(56) References Cited

U.S. PATENT DOCUMENTS

2012/0080700 A1* 4/2012 Chang ................. H10H 20/854
257/E33.059
2014/0098515 A1 4/2014 Ltd
(Continued)

FOREIGN PATENT DOCUMENTS

CN 105679196 A 6/2016
CN 109962081 A 7/2019
(Continued)

OTHER PUBLICATIONS

Copy of the Extended European Search Report in the European Patent Application No. 22963865.5, dated Feb. 17, 2025.
(Continued)

*Primary Examiner* — Mary Ellen Bowman
(74) *Attorney, Agent, or Firm* — Intellectual Valley Law, P.C.

(57) ABSTRACT

A display substrate is provided. The display substrate includes a respective encapsulated unit and a separation structure substantially surrounding the respective encapsulated unit. The respective encapsulated unit includes a color conversion layer comprising one or more color conversion blocks; and a respective encapsulating block in an encapsulating layer encapsulating the one or more color conversion blocks. The encapsulating layer is at least partially absent in a peripheral region around the respective encapsulated unit.

20 Claims, 30 Drawing Sheets

(51) Int. Cl.
　　H10H 20/851　　　(2025.01)
　　H10W 90/00　　　(2026.01)

(56)　　　　　References Cited

U.S. PATENT DOCUMENTS

| | | | | |
|---|---|---|---|---|
| 2019/0189595 A1* | 6/2019 | Lee | ................... | H01L 25/0753 |
| 2020/0373359 A1 | 11/2020 | Ltd | | |
| 2021/0135155 A1* | 5/2021 | Xu | ................... | H10K 59/124 |
| 2021/0159278 A1 | 5/2021 | Ltd | | |
| 2021/0305535 A1 | 9/2021 | Ltd | | |
| 2022/0077251 A1* | 3/2022 | Choung | ............. | H10K 59/873 |
| 2022/0190039 A1 | 6/2022 | Ltd | | |
| 2022/0285428 A1* | 9/2022 | Jo | ................... | H10H 20/851 |
| 2022/0344406 A1 | 10/2022 | Ltd | | |
| 2023/0037888 A1* | 2/2023 | Yeon | ................... | H10H 20/835 |
| 2023/0056289 A1* | 2/2023 | Yang | ................... | H10K 71/00 |
| 2023/0143994 A1* | 5/2023 | Kim | ................... | H10K 59/18 |
| | | | | 257/40 |

FOREIGN PATENT DOCUMENTS

| | | | |
|---|---|---|---|
| CN | 110350055 | A | 10/2019 |
| CN | 111063826 | A | 4/2020 |
| CN | 111415965 | A | 7/2020 |
| CN | 112863374 | A | 5/2021 |
| CN | 113659058 | A | 11/2021 |
| CN | 114300482 | A | 4/2022 |
| CN | 114464754 | A | 5/2022 |
| CN | 114628439 | A | 6/2022 |
| CN | 114639765 | A | 6/2022 |
| CN | 114843419 | A | 8/2022 |
| CN | 115117269 | A | 9/2022 |
| JP | 6553259 | B2 | 7/2019 |

OTHER PUBLICATIONS

International Search Report & Written Opinion mailed Jun. 15, 2023, regarding PCT/CN2022/129195.

\* cited by examiner

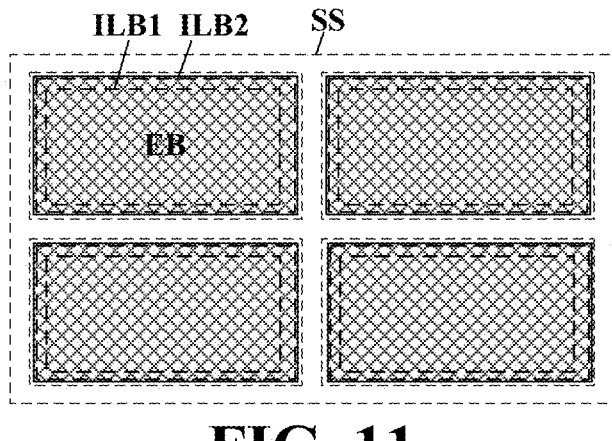
FIG. 11
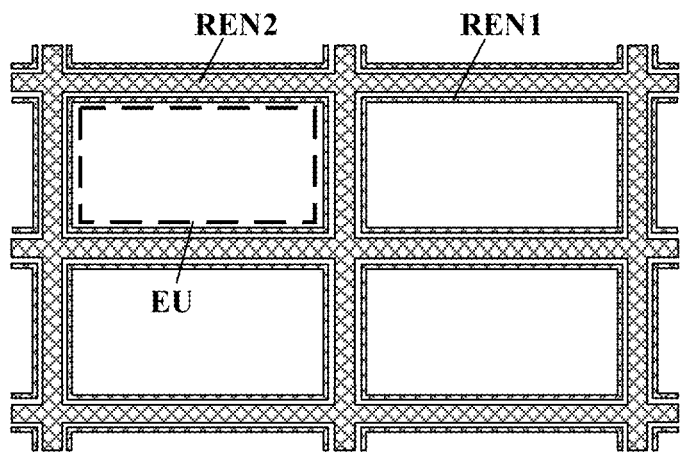
FIG. 12A
FIG. 12B

RILB1  REN1  RILB2

REB

RSS

BS2

REN1

REB

RSS

RL1

1

DISPLAY SUBSTRATE, DISPLAY PANEL, DISPLAY APPARATUS, AND METHOD OF FABRICATING DISPLAY SUBSTRATE

CROSS-REFERENCE TO RELATED APPLICATION

This application is a national stage application under 35 U.S.C. § 371 of International Application No. PCT/CN2022/129195, filed Nov. 2, 2022, the contents of which are incorporated by reference in the entirety.

TECHNICAL FIELD

The present invention relates to display technology, more particularly, to a display substrate, a display panel, a display apparatus, and a method of fabricating a display substrate.

BACKGROUND

Quantum dots material has excellent optical and electrical properties, including a narrow emission peak (with a half-peak width of approximately 30 nm), a tunable spectrum (ranging from visible light to infrared light), high photo-chemical stability, and a low starting voltage. Wavelengths of light emitted from quantum dots materials are tunable at least in part based on the particle sizes of the quantum dots. Due to these excellent properties, quantum dots have become a focus of research and development in the fields of display technology.

SUMMARY

In one aspect, the present disclosure provides a display substrate, comprising a respective encapsulated unit and a separation structure substantially surrounding the respective encapsulated unit; wherein the respective encapsulated unit comprises a color conversion layer comprising one or more color conversion blocks; and a respective encapsulating block in an encapsulating layer encapsulating the one or more color conversion blocks; wherein the encapsulating layer is at least partially absent in a peripheral region around the respective encapsulated unit.

Optionally, the respective encapsulated unit further comprises a base substrate on a side of the color conversion layer away from the respective encapsulating block; and the base substrate is at least partially uncovered.

Optionally, the respective encapsulated unit further comprises a base substrate; a respective first inter layer block in a first inter layer on the base substrate; and a respective second inter layer block in a second inter layer on a side of the first inter layer away from the base substrate.

Optionally, the first inter layer and the second inter layer comprise insulating materials of different etch selectivity; and the first inter layer comprises a material having a higher etch selectivity with respect to a material of the second inter layer.

Optionally, each of the first inter layer and the second inter layer is at least partially absent in the peripheral region around the respective encapsulated unit.

Optionally, the separation structure comprises a first residual encapsulating layer comprising a ring substantially surrounding the respective encapsulated unit.

Optionally, the first residual encapsulating layer is at least partially absent in the peripheral region around the respective encapsulated unit.

2

Optionally, the separation structure further comprises a stacked structure on a side of the ring of the first residual encapsulating layer away from the respective encapsulated unit; and the stacked structure substantially surrounds the ring of the first residual encapsulating layer.

Optionally, the stacked structure comprises a first residual layer; and a second residual layer on a side of the first residual layer away from a base substrate.

Optionally, an orthographic projection of the second residual encapsulating layer on the base substrate covers an orthographic projection of the first residual layer on the base substrate; and in a cross-section along a plane perpendicular to a surface of the base substrate and intersecting the respective encapsulated unit and the first residual encapsulating layer, the second residual layer has a width greater than a width of the first residual layer.

Optionally, the stacked structure further comprises a second residual encapsulating layer on a side of the second residual layer away from the first residual layer; and the first residual encapsulating layer, the second residual encapsulating layer, and the encapsulating layer are in a same layer.

Optionally, an orthographic projection of the second residual encapsulating layer on the base substrate covers an orthographic projection of the first residual layer on the base substrate; and in a cross-section along a plane perpendicular to a surface of the base substrate and intersecting the respective encapsulated unit and the first residual encapsulating layer, the second residual encapsulating layer has a width greater than a width of the first residual layer.

Optionally, the display substrate further comprises a light emitting element substrate comprising a plurality of light emitting elements and a sealant layer; wherein the sealant layer attaches the light emitting element substrate and the respective encapsulated unit together.

In another aspect, the present disclosure provides a display panel, comprising the display substrate described herein or fabricated by a method described herein, and a transistor substrate comprising a plurality of thin film transistors.

Optionally, the display panel comprises a plurality of islands spaced apart from each other and on the transistor substrate; wherein a respective island of the plurality of islands comprises the respective encapsulated unit.

Optionally, the respective island further comprises a plurality of contact pins and a plurality of light emitting elements; a respective light emitting element of the plurality of light emitting elements is electrically connected to at least one of the plurality of contact pads; the transistor substrate comprises a plurality of thin film transistors and a plurality of contract pads; at least one contact pad of the plurality of contact pads is electrically connected to a thin film transistor of the plurality of thin film transistors; and a respective contact pin of the plurality of contact pins is electrically connected to an individual contact pad of the plurality of contact pads.

In another aspect, the present disclosure provides a display apparatus, comprising the display panel described herein or fabricated by a method described herein, and one or more integrated circuits connected to the display panel.

In another aspect, the present disclosure provides a method of fabricating a display substrate, comprising forming a respective encapsulated unit and forming a separation structure substantially surrounding the respective encapsulated unit; wherein forming the respective encapsulated unit comprises forming a color conversion layer comprising one or more color conversion blocks; and forming a respective encapsulating block in an encapsulating layer encapsulating the one or more color conversion blocks; wherein the encapsulating layer is at least partially absent in a peripheral region around the respective encapsulated unit.

Optionally, the method comprises forming a first inter material layer on a base substrate; forming a second inter material layer on a side of the first inter material layer away from the base substrate, wherein the first inter layer and the second inter layer comprise insulating materials of different etch selectivity; forming a photoresist layer on a side of the second inter material layer away from the first inter material layer; and etching the first inter material layer and the second inter material layer using an etchant, thereby forming a stacked structure, a first inter layer, and a second inter layer; wherein the stacked structure comprises a first residual layer; and a second residual layer on a side of the first residual layer away from the base substrate.

Optionally, the method further comprises depositing an encapsulating material on a side of the second residual layer and the second inter layer away from the base substrate; wherein the encapsulating material deposited on the substrate segregated into at least an encapsulating layer, a first residual encapsulating layer, and a second residual encapsulating layer.

In another aspect, the present disclosure provides a color conversion substrate, comprising a plurality of encapsulated units, and a separation structure spacing apart the plurality of encapsulated units and substantially surrounding a respective encapsulated unit of the plurality of encapsulated units; wherein the separation structure comprises a stacked structure having a first residual layer and a second residual layer stacked on each other; an orthographic projection of the second residual encapsulating layer on a base substrate covers an orthographic projection of the first residual layer on the base substrate; in a cross-section along a plane perpendicular to a surface of the base substrate and intersecting the respective encapsulated unit, the first residual layer, and the second residual layer, the second residual layer has a width greater than a width of the first residual layer; and the second residual layer is on a side of the first residual layer away from the base substrate.

Optionally, the stacked structure further comprises a second residual encapsulating layer on a side of the second residual layer away from the first residual layer; an orthographic projection of the second residual encapsulating layer on the base substrate covers an orthographic projection of the first residual layer on the base substrate; and in the cross-section along the plane perpendicular to the surface of the base substrate and intersecting the respective encapsulated unit, the first residual layer, and the second residual layer, the second residual encapsulating layer has a width greater than a width of the first residual layer.

Optionally, the first residual layer is a network continuously extending throughout the region between adjacent encapsulated units of the plurality of encapsulated units; the second residual layer is a network continuously extending throughout the region between adjacent encapsulated units of the plurality of encapsulated units; and the second residual encapsulating layer is a network continuously extending throughout the region between adjacent encapsulated units of the plurality of encapsulated units.

Optionally, the separation structure further comprises a first residual encapsulating layer; the first residual encapsulating layer comprises a plurality of rings; and a respective ring of the plurality of rings substantially surrounds the respective encapsulated unit.

Optionally, an orthographic projection of the first residual encapsulating layer on the base substrate is substantially non-overlapping with an orthographic projection of the second residual encapsulating layer on the base substrate; and the second residual encapsulating layer substantially surrounds the respective ring.

Optionally, the respective encapsulated unit comprises a color conversion layer comprising one or more color conversion blocks; and a respective encapsulating block in an encapsulating layer encapsulating the one or more color conversion blocks; wherein the encapsulating layer is at least partially absent in a region between adjacent encapsulated units of the plurality of encapsulated units.

Optionally, the color conversion substrate further comprises the base substrate on a side of the color conversion layer away from the respective encapsulating block; and the base substrate is at least partially uncovered in the region between adjacent encapsulated units of the plurality of encapsulated units.

Optionally, the respective encapsulated unit further comprises a respective first inter layer block in a first inter layer on the base substrate; and a respective second inter layer block in a second inter layer on a side of the first inter layer away from the base substrate.

Optionally, the first inter layer and the second inter layer comprise insulating materials of different etch selectivity; and the first inter layer comprises a material having a higher etch selectivity with respect to a material of the second inter layer.

Optionally, each of the first inter layer and the second inter layer is at least partially absent in the region between adjacent encapsulated units of the plurality of encapsulated units.

Optionally, the first residual layer and the first inter layer are in a same layer; and the second residual layer and the second inter layer are in a same layer.

Optionally, the encapsulating layer is in a same layer as a first residual encapsulating layer and a second residual encapsulating layer.

In another aspect, the present disclosure provides a display apparatus, comprising the color conversion substrate described herein or fabricated by a method described herein, and one or more integrated circuits connected to a display panel.

BRIEF DESCRIPTION OF THE FIGURES

The following drawings are merely examples for illustrative purposes according to various disclosed embodiments and are not intended to limit the scope of the present invention.

FIG. 11 is a schematic diagram illustrating a plurality of encapsulating blocks in a portion of a first color conversion substrate in some embodiments according to the present disclosure.

FIG. 12A is a cross-sectional view of a separation structure in some embodiments according to the present disclosure.

FIG. 12B is a plan view of a first residual encapsulating layer and a second residual encapsulating layer in some embodiments according to the present disclosure.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

Figure 1:
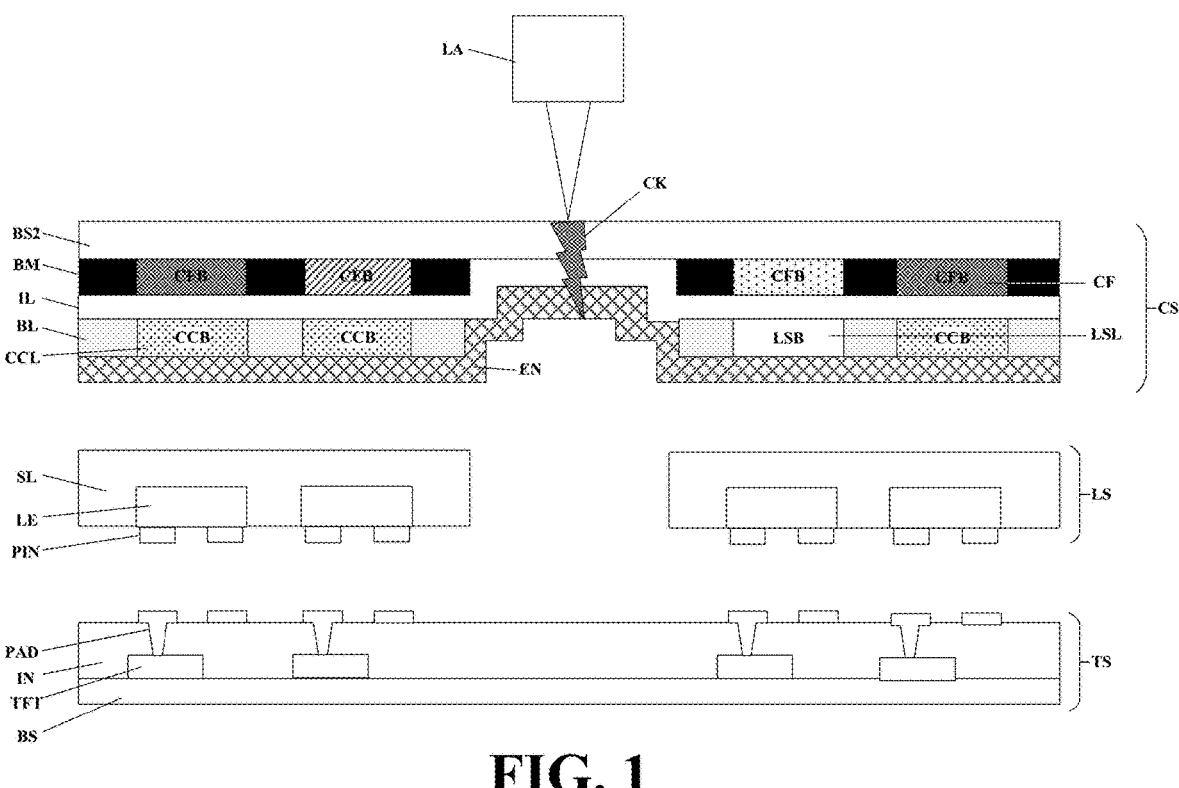
FIG. 1 illustrates a process of assembling a display panel in some embodiments according to the present disclosure.

FIG. 1 illustrates a process of assembling a display panel in some embodiments according to the present disclosure. Referring to FIG. 1, in some embodiments, the display panel is assembled using three substrates, which includes a color conversion substrate CS, a light emitting element substrate LS, and a transistor substrate TS.

In some embodiments, the transistor substrate TS includes a base substrate BS, a plurality of thin film transistors TFT on the base substrate BS, an insulating layer IN on a side of the plurality of thin film transistors TFT away from the base substrate BS, and a plurality of contract pads PAD on a side of the insulating layer IN away from the base substrate BS. Optionally, the insulating layer IN is a resin layer. At least one contact pad of the plurality of contact pads PAD is electrically connected to a thin film transistor of the plurality of thin film transistors TFT though the insulating layer IN.

In some embodiments, the light emitting element substrate LS includes a plurality of contact pins PIN and a plurality of light emitting elements LE. In the light emitting element substrate LS, a respective light emitting element of the plurality of light emitting elements LE is electrically connected to at least one of the plurality of contact pads PAD. When the display panel is assembled, a respective contact pin of the plurality of contact pins PIN is electrically connected to an individual contact pad of the plurality of contact pads PAD.

Various appropriate light emitting elements may be implemented in the present disclosure. In one example, the plurality of light emitting elements LE include a plurality of micro light emitting diodes. In another example, the plurality of light emitting elements LE include a plurality of mini light emitting diodes. In another example, the plurality of light emitting elements LE include a plurality of organic light emitting diodes.

In one example, the plurality of light emitting elements LE are a plurality of blue light emitting elements.

In some embodiments, the light emitting element substrate LS further includes a sealant layer SL on a side of the plurality of light emitting elements LE away from the plurality of contact pins PIN. When the display panel is assembled, the sealant layer SL attaches the light emitting element substrate LS and the color conversion substrate CS together.

In some embodiments, the color conversion substrate CS includes a second base substrate BS2, a black matrix BM and a color filter CF on the second base substrate BS2. The color filter CF in some embodiments includes a plurality of color filter blocks CFB. For example, the plurality of color filter blocks CFB include a red color filter block, a green color filter block, and a blue color filter block. Optionally, a respective color filter block of the plurality of color filter blocks CFB is at least partially in a light transmissive region. Optionally, the black matrix BM is in a light block region.

In some embodiments, the color conversion substrate CS further includes an inter layer IL on a side of the black matrix BM and the color filter CF away from the second base substrate BS2; a bank layer BL, a color conversion layer CCL, and a light scattering layer LSL on a side of the inter layer IL away from the second base substrate BS2; and an encapsulating layer EN on a side of the bank layer BL, the color conversion layer CCL, and the light scattering layer LSL away from the second base substrate BS2. Optionally, the color conversion layer CCL includes a plurality of color conversion blocks CCB, a respective color conversion block of the plurality of color conversion blocks CCB being at least partially in an individual light transmissive region. Optionally, the light scattering layer LSL includes a plurality of light scattering blocks LSB, a respective light scattering block of the plurality of light scattering blocks LSB being at least partially in an individual light transmissive region. The encapsulating layer EN encapsulates the color conversion layer CCL and the light scattering layer LSL to prevent air or moisture from entering the color conversion substrate CS.

The black matrix BM and the color filter CF prevents excitation of the color conversion material by external light.

Figure 2A:
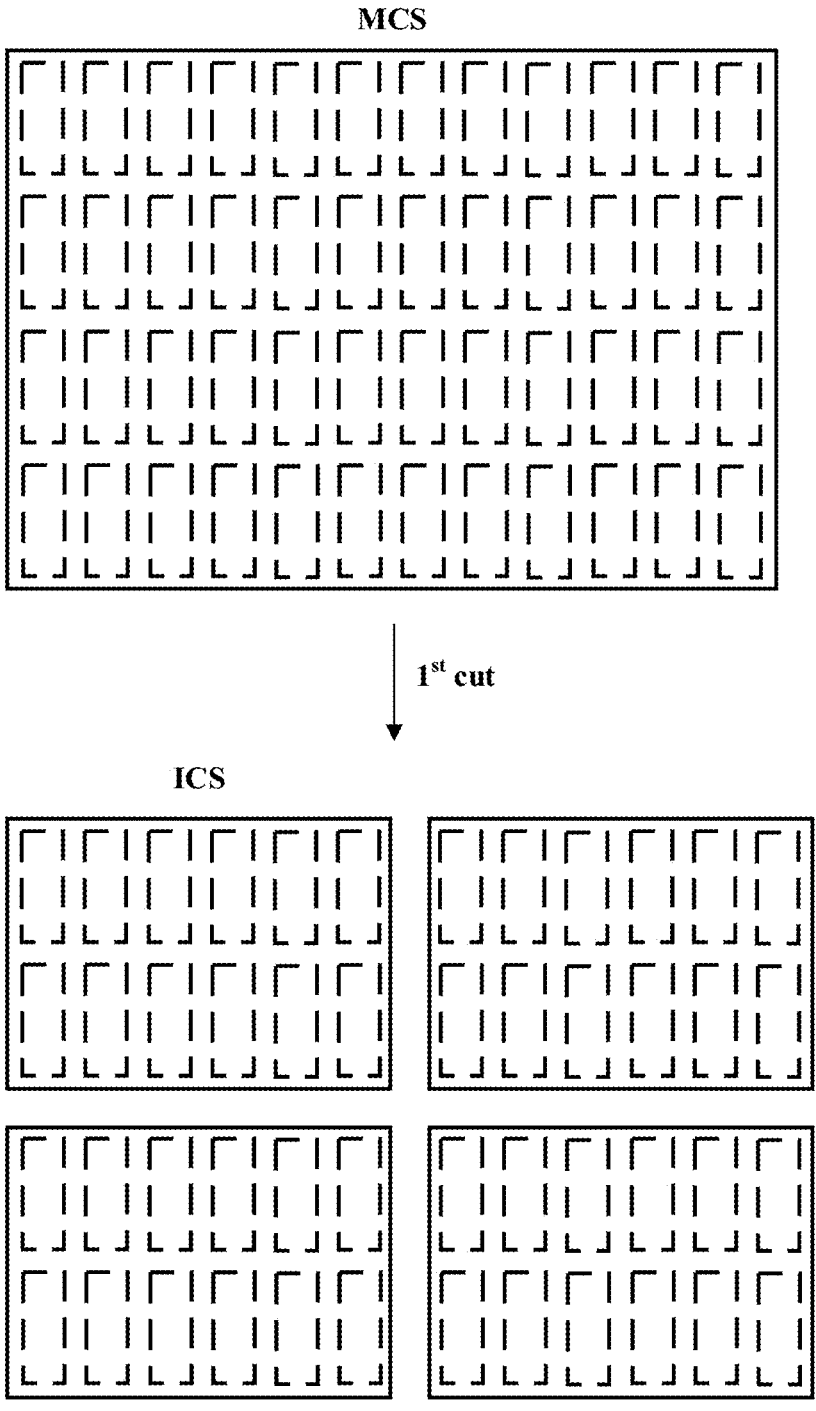
FIG. 2A to FIG. 2C illustrate a process of assembling a display panel in some embodiments according to the present disclosure.
Figure 2B:
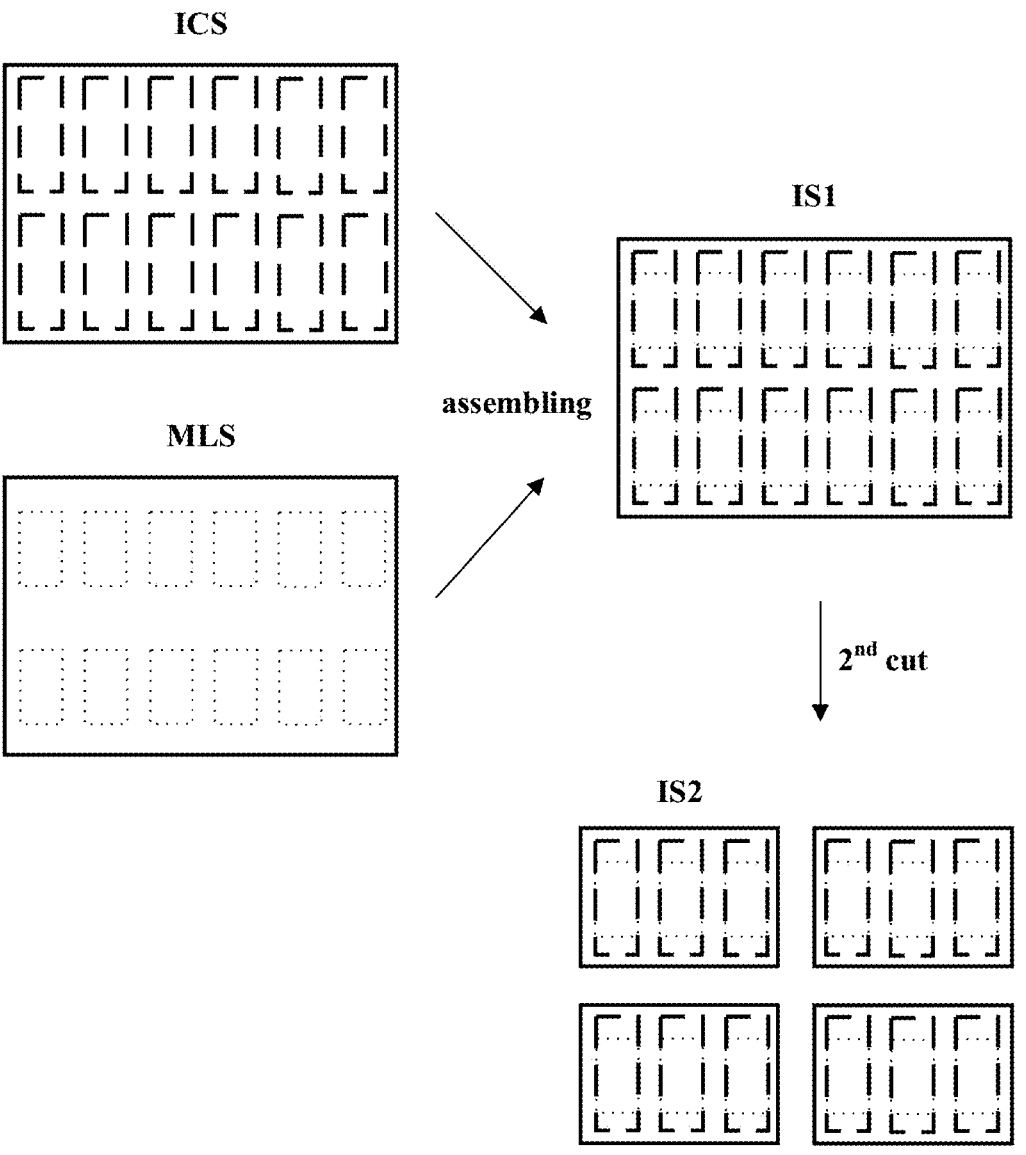
Figure 2C:
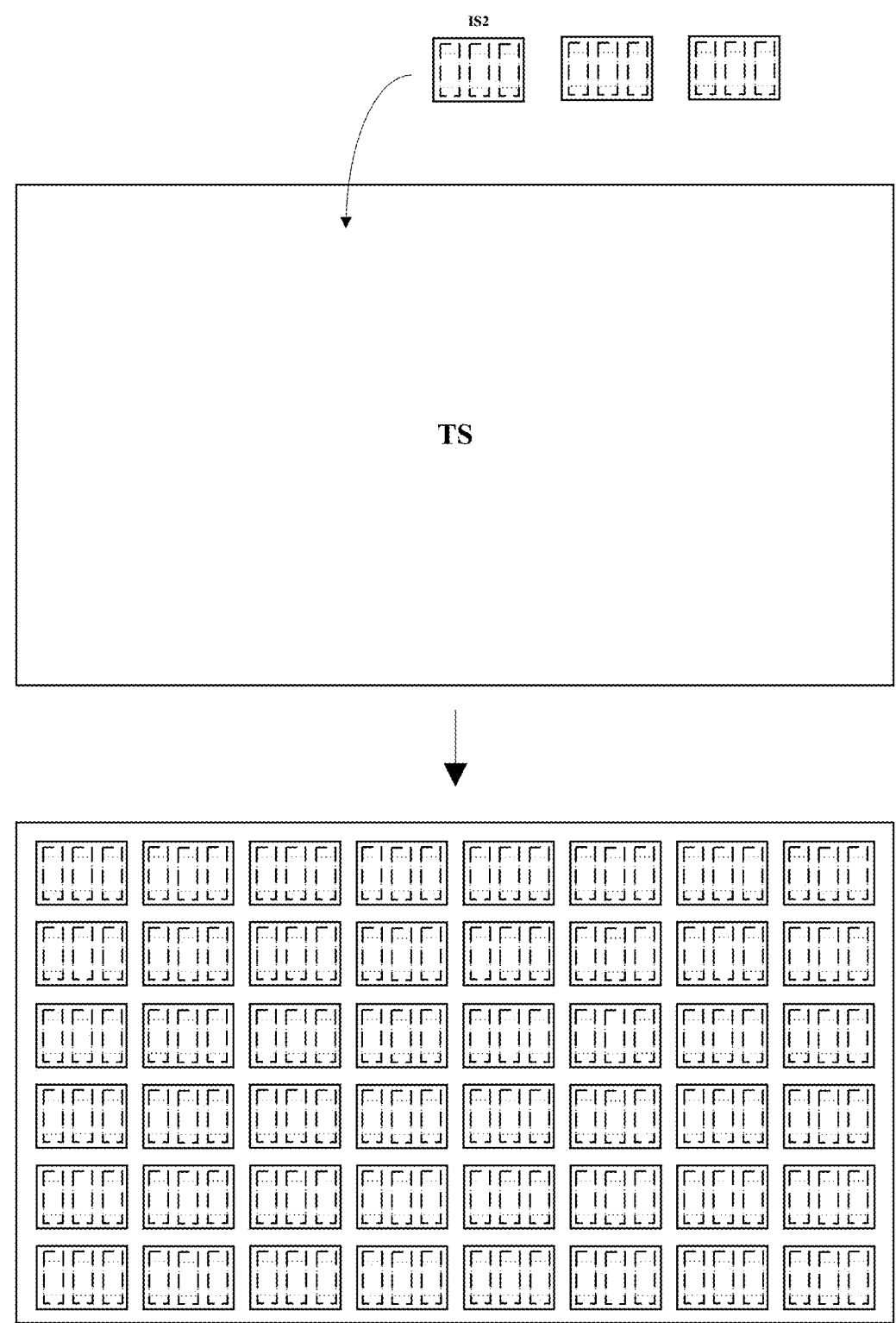

FIG. 2A to FIG. 2C illustrate a process of assembling a display panel in some embodiments according to the present disclosure. Referring to FIG. 2A, a color conversion mother substrate MCS is cut ("1$^{st}$ cut") into a plurality of intermediate color conversion substrates ICS. The size of a respective one of the plurality of intermediate color conversion substrates ICS may be the same as a size of a light emitting element mother substrate. The 1$^{st}$ cut is performed so that the color conversion mother substrate MCS is segregated into the plurality of intermediate color conversion substrates ICS, to facilitate assembly of a respective intermediate color conversion substrate with a light emitting element mother substrate, which have a matching size.

Referring to FIG. 2B, a respective intermediate color conversion substrate of the plurality of intermediate color conversion substrates ICS is assembled with a light emitting element mother substrate MLS into a first intermediate substrate IS1. The first intermediate substrate IS1 thus includes a plurality of color conversion blocks, a plurality of light scattering blocks, and a plurality of light emitting elements. The first intermediate substrate IS1 is then cut ("2$^{nd}$ cut") into a plurality of second intermediate substrates IS2. A respective second intermediate substrate of the plurality of second intermediate substrates IS2 may include one or more light emitting elements. In one example depicted in FIG. 2B, the respective second intermediate substrate of the plurality of second intermediate substrates IS2 includes three light emitting elements. Various alternative implementations may be practiced according to the present disclosure. In another example, the respective second intermediate substrate of the plurality of second intermediate substrates IS2 includes 12 light emitting elements.

Referring to FIG. 2C, a transistor substrate TS is provided. The plurality of second intermediate substrates IS2 are mass transferred onto the transistor substrate TS. For example, a respective second intermediate substrate of the plurality of second intermediate substrates IS2 is transferred onto the transistor substrate TS so that contact pins in the respective second intermediate substrate are connected with contact pads in the transistor substrate TS.

The inventors of the present disclosure discover that, in the process of cutting a color conversion substrate (e.g., during the "1$^{st}$ cut" or the "2$^{nd}$ cut", particularly during the "2$^{nd}$ cut"), the color conversion substrate is prone to crack and peeling defects, resulting in defective encapsulation.

Referring to FIG. 1, in one example, a laser LA is used for cutting the color conversion substrate CS (e.g., during the "2$^{nd}$ cut", in which the color conversion substrate CS is a first intermediate substrate IS1 depicted in FIG. 2B). A crack CK occurs during the cut. The inventors of the present disclosure discover that the crack CK often times is not limited to the cut region. However, the crack CK propagates along the encapsulating layer EN and/or along the inter layer IL (e.g., horizontally) into other regions (e.g., regions having color conversion blocks) of the color conversion substrate CS, leading to defective encapsulation. The color conversion substrate CS in the present disclosure, depending on the context, may refer to any one of the color conversion mother substrate, the intermediate color conversion substrate, a color conversion portion of the first intermediate substrate, a color conversion portion of a respective second intermediate substrate of the plurality of second intermediate substrate, or a color conversion portion of the display panel.

Accordingly, the present disclosure provides, inter alia, a display substrate, a display panel, a display apparatus, and a method of fabricating a display substrate that substantially obviate one or more of the problems due to limitations and disadvantages of the related art. In one aspect, the present disclosure provides a display substrate. In some embodiments, the display substrate includes a respective encapsulated unit and a separation structure substantially surrounding the respective encapsulated unit. Optionally, the respective encapsulated unit includes a color conversion layer comprising one or more color conversion blocks; and a respective encapsulating block in an encapsulating layer encapsulating the one or more color conversion blocks. Optionally, the encapsulating layer is at least partially absent in a peripheral region around the respective encapsulated unit.

Figure 3:
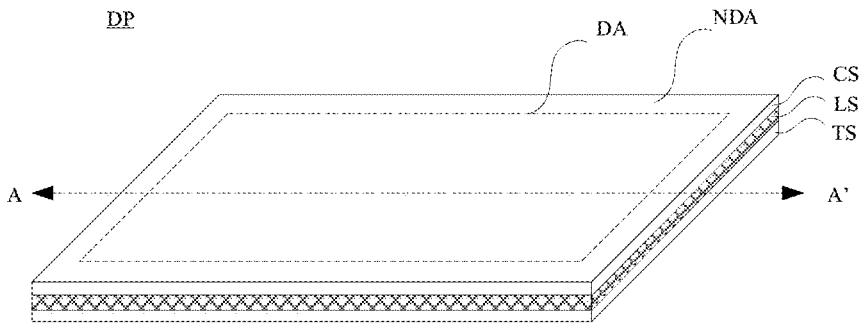
FIG. 3 is a schematic diagram illustrating the structure of a display panel in some embodiments according to the present disclosure.
Figure 4:
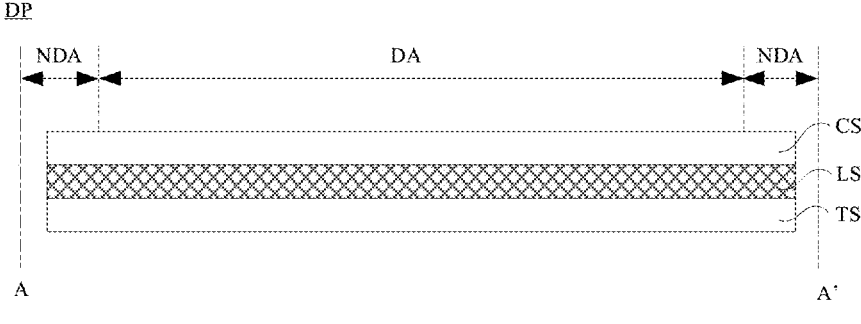
FIG. 4 is a cross-sectional view along an A-A' line in FIG. 3.

FIG. 3 is a schematic diagram illustrating the structure of a display panel in some embodiments according to the present disclosure. FIG. 4 is a cross-sectional view along an A-A' line in FIG. 3. Referring to FIG. 3 and FIG. 4, the display panel DP in some embodiments includes transistor substrate TS, a light emitting element substrate LS on the transistor substrate TS, and a color conversion substrate CS on a side of the light emitting element substrate LS away from the transistor substrate TS. The display panel DP includes a display area DA and a non-display area NDA.

Figure 5A:
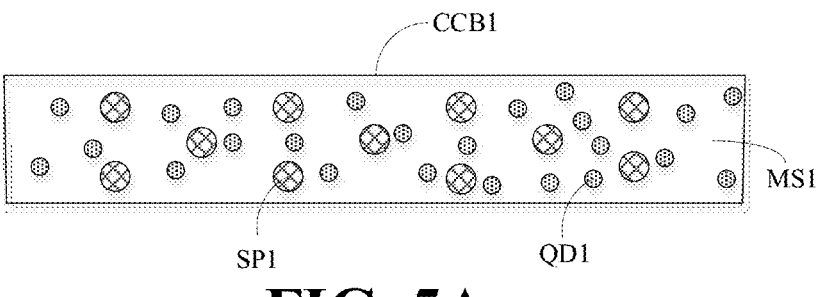
FIG. 5A is a schematic diagram illustrating the structure of a first color conversion block in some embodiments according to the present disclosure.

FIG. 5A is a schematic diagram illustrating the structure of a first color conversion block in some embodiments according to the present disclosure. Referring to FIG. 5A, the first color conversion block CCB1 is a color conversion block configured to convert a light of a third color (e.g., a blue light) into a light of a first color (e.g., a red light). In some embodiments, the first color conversion block CCB1 includes a first matrix MS1, a plurality of first scattering particles SP1 and a plurality of first quantum dots QD1 dispersed in the first matrix MS1. The first matrix MS1 may include a polymer material such as an organic polymer material. Examples of appropriate polymer materials for making the first matrix MS1 include epoxy resins, acrylic resins, polyurethane resins, silicone resins, and silane resins. Examples of appropriate materials for making the plurality of first scattering particles SP1 include $TiO_2$, ZnO, $ZrO_2$, $Al_2O_3$, $SiO_2$. Examples of appropriate quantum dots materials for making the plurality of first quantum dots QD1 include a quantum dots material of a first color (e.g., a red color). The quantum dots material may include a material selected from a group consisting of CdS, CdSe, ZnSe, InP, PbS, $CsPbCl_3$, $CsPbBr_3$, $CsPhI_3$, CdS/ZnS, CdSe/ZnS, InP/ZnS, PbS/ZnS, $CsPbCl_3$/ZnS, $CsPbBr_3$/ZnS, and $CsPhI_3$/ZnS.

Figure 5B:
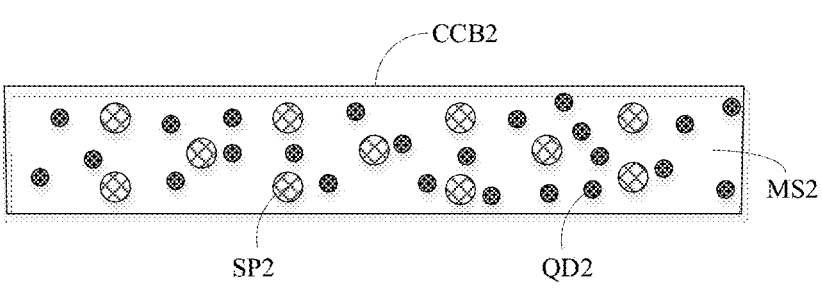
FIG. 5B is a schematic diagram illustrating the structure of a second color conversion block in some embodiments according to the present disclosure.

FIG. 5B is a schematic diagram illustrating the structure of a second color conversion block in some embodiments according to the present disclosure. Referring to FIG. 5B, the second color conversion block CCB2 is a color conversion block configured to convert a light of a third color (e.g., a blue light) into a light of a second color (e.g., a green light). In some embodiments, the second color conversion block CCB2 includes a second matrix MS2, a plurality of second scattering particles SP2 and a plurality of second quantum dots QD2 dispersed in the second matrix MS2. The second matrix MS2 may include a polymer material such as an organic polymer material. Examples of appropriate polymer materials for making the second matrix MS2 include epoxy resins, acrylic resins, polyurethane resins, silicone resins, and silane resins. Examples of appropriate materials for making the plurality of second scattering particles SP2 include $TiO_2$, ZnO, $ZrO_2$, $Al_2O_3$, $SiO_2$. Examples of appropriate quantum dots materials for making the plurality of second quantum dots QD2 include a quantum dots material of a second color (e.g., a green color). The quantum dots material may include a material selected from a group consisting of CdS, CdSe, ZnSe, InP, PbS, $CsPbCl_3$, $CsPbBr_3$, $CsPhI_3$, CdS/ZnS, CdSe/ZnS, InP/ZnS, PbS/ZnS, $CsPbCl_3$/ZnS, $CsPbBr_3$/ZnS, and $CsPhI_3$/ZnS.

Figure 5C:
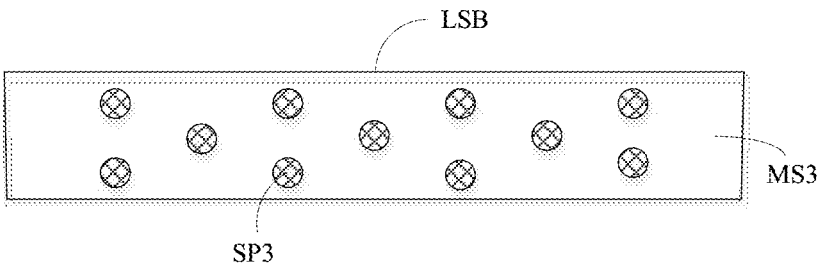
FIG. 5C is a schematic diagram illustrating the structure of a light scattering block in some embodiments according to the present disclosure.

FIG. 5C is a schematic diagram illustrating the structure of a light scattering block in some embodiments according to the present disclosure. Referring to FIG. 5C, the light scattering block LSB in some embodiments includes a third matrix MS3 and a plurality of third scattering particles SP3 dispersed in the third matrix MS3. The third matrix MS3 may include a polymer material such as an organic polymer material. Examples of appropriate polymer materials for making the third matrix MS3 include epoxy resins, acrylic resins, polyurethane resins, silicone resins, and silane resins. Examples of appropriate materials for making the plurality of third scattering particles SP3 include $TiO_2$, ZnO, $ZrO_2$, $Al_2O_3$, $SiO_2$.

In one example, the first matrix MS1, the second matrix MS2, and the third matrix MS3 includes a same polymer material. In another example, at least two of the first matrix MS1, the second matrix MS2, and the third matrix MS3 includes different polymer materials.

In one example, the first scattering particles SP1, the second scattering particles SP2, and the third scattering particles SP3 includes a same scattering material. In another example, at least two of the first scattering particles SP1, the second scattering particles SP2, and the third scattering particles SP3 includes different scattering materials.

Figure 6:
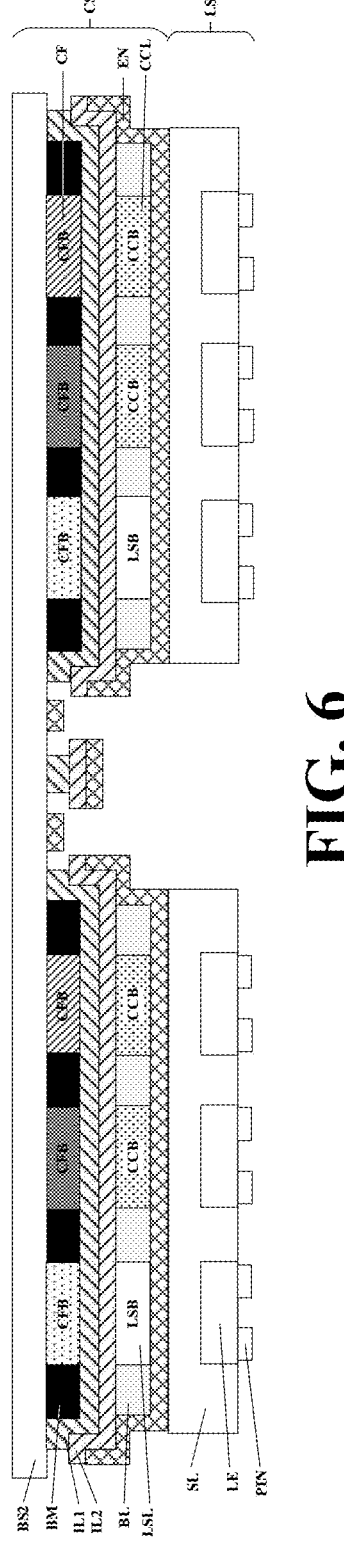
FIG. 6 is a schematic diagram illustrating the structure of a portion of a first intermediate substrate in some embodiments according to the present disclosure.

FIG. 6 is a schematic diagram illustrating the structure of a portion of a first intermediate substrate in some embodiments according to the present disclosure. Referring to FIG. 6, the first intermediate substrate in some embodiments includes a first color conversion substrate CS1 and a first light emitting element substrate LS1.

In some embodiments, the first light emitting element substrate LS1 includes a plurality of contact pins PIN and a plurality of light emitting elements LE. In the first light emitting element substrate LS1, a respective light emitting element of the plurality of light emitting elements LE is electrically connected to at least one of the plurality of contact pads PAD. When the display panel is assembled, a respective contact pin of the plurality of contact pins PIN is electrically connected to an individual contact pad of the plurality of contact pads PAD.

In some embodiments, the first light emitting element substrate LS1 further includes a sealant layer SL on a side of the plurality of light emitting elements LE away from the plurality of contact pins PIN. When the display panel is assembled, the sealant layer SL attaches the first light emitting element substrate LS1 and the first color conversion substrate CS1 together.

In some embodiments, the first color conversion substrate CS1 includes a second base substrate BS2, a black matrix BM and a color filter CF on the second base substrate BS2. The color filter CF in some embodiments includes a plurality of color filter blocks CFB. For example, the plurality of color filter blocks CFB include a red color filter block, a green color filter block, and a blue color filter block. Optionally, a respective color filter block of the plurality of color filter blocks CFB is at least partially in a light transmissive region. Optionally, the black matrix BM is in a light block region.

In some embodiments, the first color conversion substrate CS1 further includes a first inter layer IL1 on a side of the black matrix BM and the color filter CF away from the second base substrate BS2; a second inter layer IL2 on a side of the first inter layer IL1 away from the second base substrate BS2; a bank layer BL, a color conversion layer CCL, and a light scattering layer LSL on a side of the second inter layer IL2 away from the second base substrate BS2; and an encapsulating layer EN on a side of the bank layer BL, the color conversion layer CCL, and the light scattering layer LSL away from the second base substrate BS2. Optionally, the color conversion layer CCL includes a plurality of color conversion blocks CCB, a respective color conversion block of the plurality of color conversion blocks CCB being at least partially in an individual light transmissive region. Optionally, the light scattering layer LSL includes a plurality of light scattering blocks LSB, a respective light scattering block of the plurality of light scattering blocks LSB being at least partially in an individual light transmissive region. The encapsulating layer EN encapsulates the color conversion layer CCL and the light scattering layer LSL to prevent air or moisture from entering the first color conversion substrate CS1. The black matrix BM and the color filter CF prevents excitation of the color conversion material by external light.

In some embodiments, the first inter layer IL1 has a relatively low refractive index, for example, a refractive index lower than a refractive index of the second inter layer IL2. By having the refractive index of the first inter layer IL1 lower than the refractive index of the second inter layer IL2, the structure of the first color conversion substrate CS1 facilitates light extraction in a display panel having this structure. Various appropriate insulating materials may be used for making the first inter layer IL1. Examples of insulating materials for making the first inter layer IL1 include silicon oxide ($Si_xO_y$). In one example, the first inter layer IL1 has a refractive index less than 1.6.

In some embodiments, the second inter layer IL2 has a relatively low water vapor transmittance rate. Optionally, the second inter layer IL2 with a thickness of 100 nm has a water vapor transmittance rate of 0.25 $g/m^2 \cdot day$ or less, e.g., 0.20 $g/m^2 \cdot day$ or less, 0.15 $g/m^2 \cdot day$ or less, 0.10 $g/m^2 \cdot day$ or less, 0.05 $g/m^2 \cdot day$ or less, 0.02 $g/m^2 \cdot day$ or less, or 0.01 $g/m^2 \cdot day$ or less. Optionally, the second inter layer IL2 has a water vapor transmittance rate lower than a water vapor transmittance rate of the first inter layer IL1, e.g., by at least 1%, by at least 5%, by at least 10%, by at least 15%, by at least 20%, by at least 25%, by at least 30%, by at least 35%, or by at least 40%. Various appropriate insulating materials may be used for making the second inter layer IL2. Examples of insulating materials for making the first inter layer IL1 include silicon oxynitride ($Si_xO_yN_z$), silicon nitride ($Si_xN_y$), and aluminum oxide. By having the second inter layer IL2, it prevents external air and moisture from entering the first color conversion substrate CS1, enhancing lifetime of the display panel.

Figure 7:
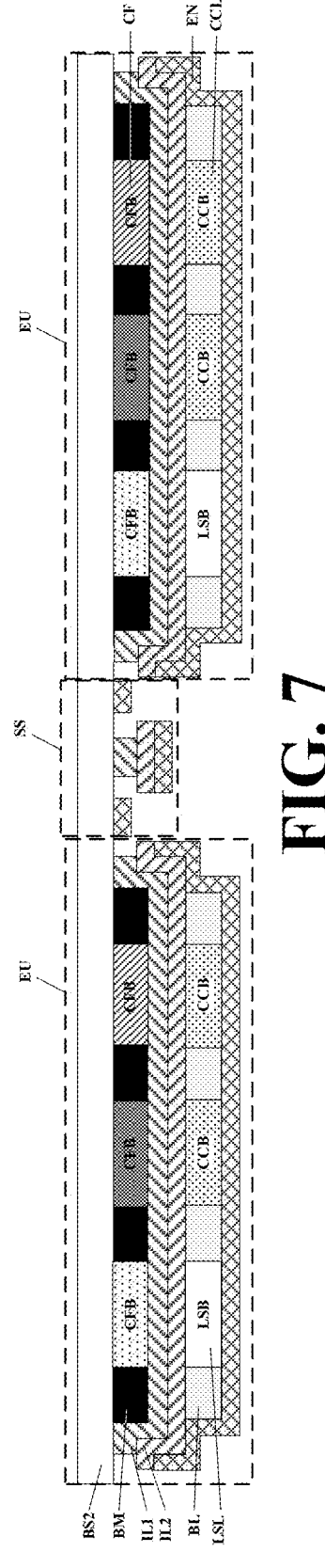
FIG. 7 is a schematic diagram illustrating the structure of a portion of a first color conversion substrate in some embodiments according to the present disclosure.
Figure 8:
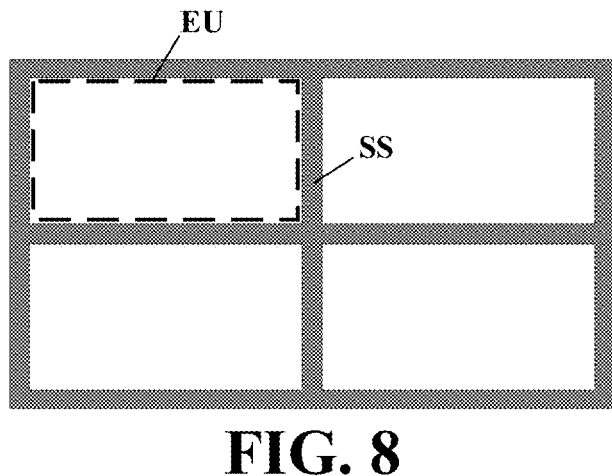
FIG. 8 is a plan view of a first color conversion substrate in some embodiments according to the present disclosure.
Figure 9:
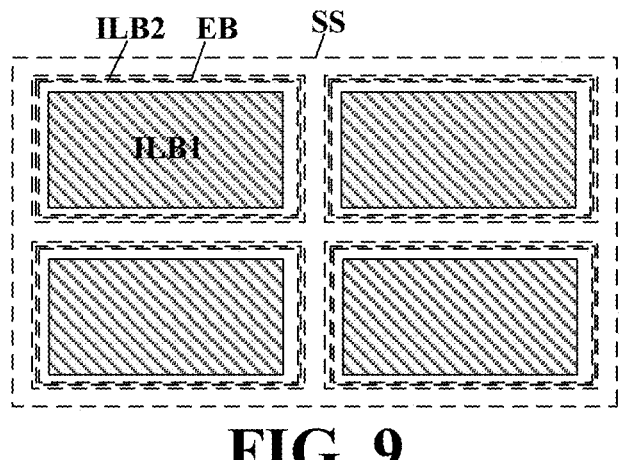
FIG. 9 is a schematic diagram illustrating a plurality of first inter layer blocks in a portion of a first color conversion substrate in some embodiments according to the present disclosure.
Figure 10:
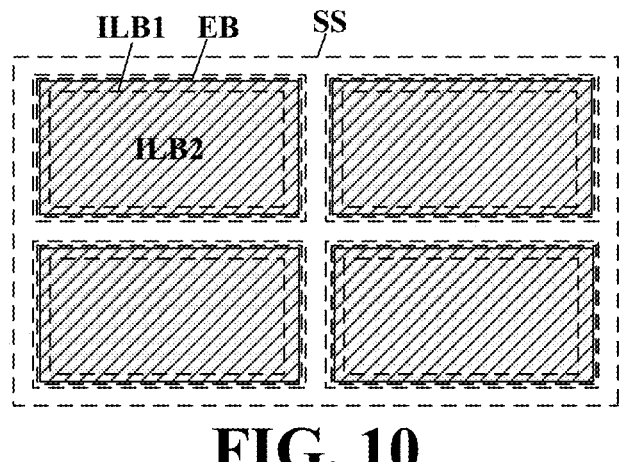
FIG. 10 is a schematic diagram illustrating a plurality of second inter layer blocks in a portion of a first color conversion substrate in some embodiments according to the present disclosure.

FIG. 7 is a schematic diagram illustrating the structure of a portion of a first color conversion substrate in some embodiments according to the present disclosure. FIG. 8 is a plan view of a first color conversion substrate in some embodiments according to the present disclosure. FIG. 9 is a schematic diagram illustrating a plurality of first inter layer blocks in a portion of a first color conversion substrate in some embodiments according to the present disclosure. FIG. 10 is a schematic diagram illustrating a plurality of second inter layer blocks in a portion of a first color conversion substrate in some embodiments according to the present disclosure. FIG. 11 is a schematic diagram illustrating a plurality of encapsulating blocks in a portion of a first color conversion substrate in some embodiments according to the present disclosure. In FIG. 9, the plurality of first inter layer blocks ILB1 are depicted in blocks, boundaries of the plurality of encapsulating blocks EB and the plurality of second inter layer blocks ILB2 are denoted in dotted lines. In FIG. 10, the plurality of second inter layer blocks ILB2 are depicted in blocks, boundaries of the plurality of encapsulating blocks EB and the plurality of first inter layer blocks ILB1 are denoted in dotted lines. In FIG. 11, the plurality of encapsulating blocks EB are depicted in blocks, boundaries of the plurality of second inter layer blocks ILB2 and the plurality of first inter layer blocks ILB1 are denoted in dotted lines. A boundary of a respective second inter layer block of the plurality of second inter layer blocks ILB2 substantially overlaps with a boundary of a respective encapsulating block of the plurality of encapsulating blocks EB.

Referring to FIG. 7 to FIG. 11, in some embodiments, the encapsulating layer EN includes a plurality of encapsulating blocks EB in a plurality of encapsulated units EU, respectively. The plurality of encapsulating blocks EB are at least partially segregated from each other. In one example, the plurality of encapsulating blocks EB are completely segregated from each other. In some embodiments, the second inter layer IL2 includes a plurality of second inter layer blocks ILB2 in the plurality of encapsulated units EU, respectively. The plurality of second inter layer blocks ILB2 are at least partially segregated from each other. In one example, the plurality of second inter layer blocks ILB2 are completely segregated from each other. In some embodiments, the first inter layer IL1 includes a plurality of first inter layer blocks ILB1 in the plurality of encapsulated units EU, respectively. The plurality of first inter layer blocks ILB1 are at least partially segregated from each other. In one example, the plurality of first inter layer blocks ILB1 are completely segregated from each other.

Referring to FIG. 7 and FIG. 8, the first color conversion substrate in some embodiments includes a plurality of encapsulated units EU spaced apart by a separation structure SS. The plurality of encapsulated units EU and the separation structure SS are on the second base substrate BS2.

Referring to FIG. 7 to FIG. 11, a respective encapsulated unit EU includes a second base substrate BS2, a black matrix BM and a color filter CF on the second base substrate BS2; a respective first inter layer block of the plurality of first inter layer blocks ILB1 on a side of the black matrix BM and the color filter CF away from the second base substrate BS2; a respective second inter layer block of the plurality of second inter layer blocks ILB2 on a side of the respective first inter layer block away from the second base substrate BS2; a bank layer BL, a color conversion layer CCL, and a light scattering layer LSL on a side of the respective second inter layer block away from the second base substrate BS2; and a respective encapsulating block of the plurality of encapsulating blocks EB on a side of the bank layer BL, the color conversion layer CCL, and the light scattering layer LSL away from the second base substrate BS2. Optionally, the color conversion layer CCL includes a plurality of color conversion blocks CCB, a respective color conversion block of the plurality of color conversion blocks CCB being at least partially in an individual light transmissive region. Optionally, the light scattering layer LSL includes a plurality of light scattering blocks LSB, a respective light scattering block of the plurality of light scattering blocks LSB being at least partially in an individual light transmissive region. The respective encapsulating block encapsulates the color conversion layer CCL and the light scattering layer LSL in the respective encapsulated unit to prevent air or moisture from entering the respective encapsulated unit. The black matrix BM and the color filter CF prevents excitation of the color conversion material by external light.

In some embodiments, the encapsulating layer EN is at least partially absent in a region between adjacent encapsulated units of the plurality of encapsulated units EU. As shown in FIG. 6 and FIG. 7, optionally the second base substrate BS2 is at least partially uncovered, e.g., by the encapsulating layer EN in the region between adjacent encapsulated units of the plurality of encapsulated units EU. Referring to FIG. 7 and FIG. 8, adjacent encapsulating blocks of the plurality of encapsulating blocks EB respectively in adjacent encapsulated units of the plurality of encapsulated units EU are segregated from each other.

In some embodiments, the second inter layer IL2 is at least partially absent in a region between adjacent encapsulated units of the plurality of encapsulated units EU. As shown in FIG. 6 and FIG. 7, optionally the second base substrate BS2 is at least partially uncovered, e.g., by the second inter layer IL2 in the region between adjacent encapsulated units of the plurality of encapsulated units EU. Referring to FIG. 7 and FIG. 8, adjacent second inter layer blocks of the plurality of second inter layer blocks ILB2 respectively in adjacent encapsulated units of the plurality of encapsulated units EU are segregated from each other.

In some embodiments, the first inter layer IL1 is at least partially absent in a region between adjacent encapsulated units of the plurality of encapsulated units EU. As shown in FIG. 6 and FIG. 7, optionally the second base substrate BS2 is at least partially uncovered, e.g., by the first inter layer IL1 in the region between adjacent encapsulated units of the plurality of encapsulated units EU. Referring to FIG. 7 and FIG. 8, adjacent first inter layer blocks of the plurality of first inter layer blocks ILB1 respectively in adjacent encapsulated units of the plurality of encapsulated units EU are segregated from each other.

Figure 12C:
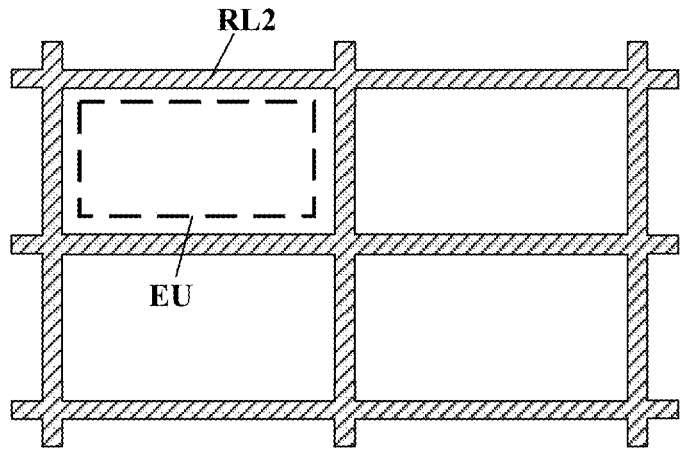
FIG. 12C is a plan view of a second residual layer in some embodiments according to the present disclosure.
Figure 12D:
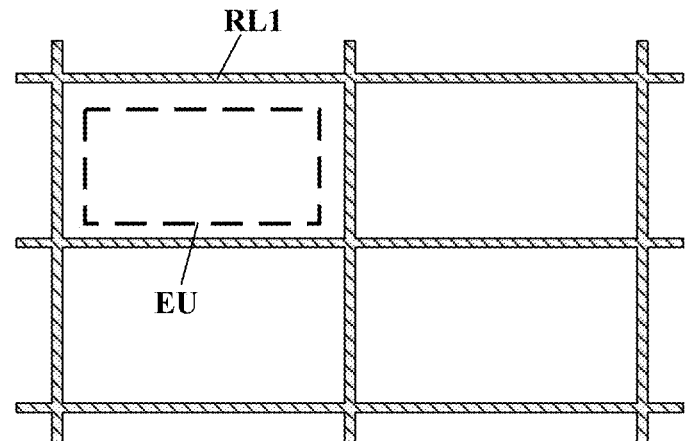
FIG. 12D is a plan view of a first residual layer in some embodiments according to the present disclosure.
Figure 12E:
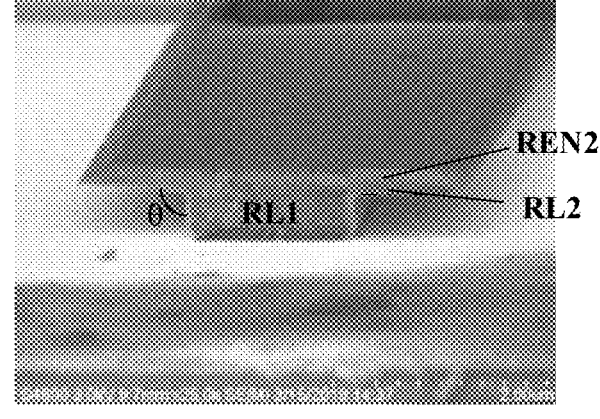
FIG. 12E is a scanning electron microscopy image of a portion of a separation structure in some embodiments according to the present disclosure.

FIG. 12A is a cross-sectional view of a separation structure in some embodiments according to the present disclosure. FIG. 12B is a plan view of a first residual encapsulating layer and a second residual encapsulating layer in some embodiments according to the present disclosure. FIG. 12C is a plan view of a second residual layer in some embodiments according to the present disclosure. FIG. 12D is a plan view of a first residual layer in some embodiments according to the present disclosure. FIG. 12E is a scanning electron microscopy image of a portion of a separation structure in some embodiments according to the present disclosure. Referring to FIG. 12A to FIG. 12E, the separation structure in some embodiments includes a first residual encapsulating layer REN1. Optionally, the first residual encapsulating layer REN1 is on the second base substrate BS2. In one example, the first residual encapsulating layer REN1 is in direct contact with the second base substrate BS2. Optionally, the first residual encapsulating layer REN1 substantially surrounds a respective encapsulated unit of the plurality of encapsulated units EU. As used herein the term "substantially surround" refers to surrounding at least 50% (e.g., at least 60%, at least 70%, at least 80%, at least 90%, at least 95%, at least 99%, and 100%) of a perimeter of an area.

In some embodiments, the first residual encapsulating layer REN1 includes a plurality of rings. A respective ring of the plurality of rings substantially surrounds the respective encapsulated unit of the plurality of encapsulated units EU. The respective ring is spaced apart from the respective encapsulated unit. As used herein, the term "ring" or "ring structure" refers to a structure or portion of a structure having a hole there through, including but not limited to a ring or doughnut shape. A ring structure may be essentially round like a doughnut, or may be formed of a square, triangle, or another shape with a hole there through. As used herein, a ring structure does not require that the ring shape be unbroken, and the term is intended to encompass structures that are substantially closed, but that comprise a break or a gap in the ring shape.

In some embodiments, the separation structure further includes a second residual encapsulating layer REN2. The second residual encapsulating layer REN2 is in a region between adjacent encapsulated units of the plurality of encapsulated units EU. Optionally, the second residual encapsulating layer REN2 substantially surrounds the respective encapsulated unit of the plurality of encapsulated units EU. In one example depicted in FIG. 12A to FIG. 12E, the second residual encapsulating layer REN2 is a network continuously extending throughout the region between adjacent encapsulated units of the plurality of encapsulated units EU.

In some embodiments, an orthographic projection of the first residual encapsulating layer REN1 (e.g., the plurality of rings) on a base substrate (e.g., the second base substrate BS2) is substantially non-overlapping with an orthographic projection of the second residual encapsulating layer REN2 on the base substrate. Optionally, the orthographic projection of the first residual encapsulating layer REN1 on the base substrate is completely non-overlapping with the orthographic projection of the second residual encapsulating layer REN2 on the base substrate. As used herein, the term "substantially non-overlapping" refers to two orthographic projections being at least 50 percent (e.g., at least 60 percent, at least 70 percent, at least 80 percent, at least 90 percent, at least 95 percent, at least 99 percent, or 100 percent) non-overlapping.

In some embodiments, the separation structure further includes a second residual layer RL2. The second residual layer RL2 is in a region between adjacent encapsulated units of the plurality of encapsulated units EU. Optionally, the second residual layer RL2 substantially surrounds the respective encapsulated unit of the plurality of encapsulated units EU. In one example depicted in FIG. 12A to FIG. 12E, the second residual layer RL2 is a network continuously extending throughout the region between adjacent encapsulated units of the plurality of encapsulated units EU.

In some embodiments, an orthographic projection of the first residual encapsulating layer REN1 (e.g., the plurality of rings) on a base substrate (e.g., the second base substrate BS2) is substantially non-overlapping with an orthographic projection of the second residual layer RL2 on the base substrate. Optionally, the orthographic projection of the first residual encapsulating layer REN1 on the base substrate is completely non-overlapping with the orthographic projection of the second residual layer RL2 on the base substrate.

In some embodiments, the separation structure further includes a first residual layer RL1. The first residual layer RL1 is in a region between adjacent encapsulated units of the plurality of encapsulated units EU. Optionally, the first residual layer RL1 substantially surrounds the respective encapsulated unit of the plurality of encapsulated units EU. In one example depicted in FIG. 12A to FIG. 12E, the first residual layer RL1 is a network continuously extending throughout the region between adjacent encapsulated units of the plurality of encapsulated units EU.

In some embodiments, an orthographic projection of the first residual encapsulating layer REN1 (e.g., the plurality of rings) on a base substrate (e.g., the second base substrate BS2) is substantially non-overlapping with an orthographic projection of the first residual layer RL1 on the base substrate. Optionally, the orthographic projection of the first residual encapsulating layer REN1 on the base substrate is completely non-overlapping with the orthographic projection of the first residual layer RL1 on the base substrate.

In some embodiments, the first residual layer RL1 is on the second base substrate BS2. In one example, the first residual layer RL1 is in direct contact with the second base substrate BS2.

In some embodiments, the second residual layer RL2 is on a side of the first residual layer RL1 away from the second base substrate BS2, and the second residual encapsulating layer REN2 is on a side of the second residual layer RL2 away from the first residual layer RL1. In one example, the second residual layer RL2 is in direct contact with the first residual layer RL1, and the second residual encapsulating layer REN2 is in direct contact with the second residual layer RL2.

In some embodiments, an orthographic projection of the second residual encapsulating layer REN2 on a base substrate covers an orthographic projection of the first residual layer RL1 on the base substrate. Optionally, in a cross-section along a plane intersecting adjacent encapsulated units of the plurality of encapsulated units EU and perpendicular to a surface of the second base substrate BS2 (e.g., the cross-section shown in FIG. 6, FIG. 7, or FIG. 12A), the second residual encapsulating layer REN2 has a width greater than a width of the first residual layer RL1, e.g., by at least 10%, by at least 15%, by at least 20%, by at least 25%, by at least 30%, by at least 35%, by at least 40%, by at least 45%, by at least 50%, by at least 55%, or by at least 60%.

In some embodiments, an orthographic projection of the second residual layer RL2 on a base substrate covers an orthographic projection of the first residual layer RL1 on the base substrate. Optionally, in a cross-section along a plane intersecting adjacent encapsulated units of the plurality of encapsulated units EU and perpendicular to a surface of the second base substrate BS2 (e.g., the cross-section shown in FIG. 6, FIG. 7, or FIG. 12A), the second residual layer RL2 has a width greater than a width of the first residual layer RL1, e.g., by at least 10%, by at least 15%, by at least 20%, by at least 25%, by at least 30%, by at least 35%, by at least 40%, by at least 45%, by at least 50%, by at least 55%, or by at least 60%.

In some embodiments, an orthographic projection of the second residual encapsulating layer REN2 on a base substrate at least partially overlaps with an orthographic projection of the second residual layer RL2 on the base substrate. Optionally, in a cross-section along a plane intersecting adjacent encapsulated units of the plurality of encapsulated units EU and perpendicular to a surface of the second base substrate BS2 (e.g., the cross-section shown in FIG. 6, FIG. 7, or FIG. 12A), the second residual encapsulating layer REN2 has a width substantially the same as a width of the second residual layer RL2. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01% of the base value.

In some embodiments, referring to FIG. 12E, the first residual layer RL1 has a slope angle θ relative to a surface of the second residual layer RL2. In the cross-section along a plane intersecting adjacent encapsulated units of the plurality of encapsulated units EU and perpendicular to a surface of the second base substrate BS2 (e.g., the cross-section shown in FIG. 6, FIG. 7, or FIG. 12A), the first residual layer RL1 has a first side closer to (e.g., in direct contact with) the second residual layer RL2, a second side opposite to the first side, and a third side connecting the first side and the second side. Optionally the slope angle is an included angle between the first side and the third side.

In some embodiments, the slope angle θ is in a range of 75 degrees to 105 degrees, e.g., 75 degrees to 80 degrees, 80 degrees to 85 degrees, 85 degrees to 90 degrees, 90 degrees to 95 degrees, 95 degrees to 100 degrees, or 100 degrees to 105 degrees.

In some embodiments, materials of the first residual layer RL1 and the second residual layer RL2 have different etch selectivity. Optionally, the first residual layer RL1 has a higher etch selectivity with respect to the second residual layer RL2. As used herein, the term "etch selectivity" refers to a rate of removal of one material relative to another material. Optionally, an etch selectivity of an etchant between the first residual layer RL1 and the second residual layer RL2 is greater than 10:1, e.g., the first residual layer RL1 is removed by the etchant at a rate approximately ten times of a removal rate of the second residual layer RL2 using a same etchant. Optionally, the etch selectivity of an etchant between the first residual layer RL1 and the second residual layer RL2 is greater than 1.1:1, e.g., greater than 1.5:1, greater than 2.0:1, greater than 3.0:1, greater than 4.0:1, greater than 5.0:1, greater than 6.0:1, greater than 7.0:1, greater than 8.0:1, greater than 9.0:1, greater than 10.0:1, greater than 15.0:1, greater than 20.0:1, greater than 25.0:1, greater than 30.0:1, greater than 35.0:1, greater than 40.0:1, greater than 45.0:1, greater than 50.0:1, greater than 55.0:1, greater than 60.0:1, greater than 65.0:1, greater than 70.0:1, greater than 75.0:1, greater than 80.0:1, greater than 85.0:1, greater than 90.0:1, greater than 95.0:1, or greater than 100.0:1. Optionally, the etchant is a wet etchant. Optionally, the etchant is a dry etchant. In one example, the etchant includes hydrogen fluoride, e.g., in gas form or in solution form.

In one example, the first residual layer RL1 includes silicon oxide, and the second residual layer RL2 includes silicon nitride.

In another example, the first residual layer RL1 includes silicon oxide, and the second residual layer RL2 includes aluminum oxide.

In another example, the first residual layer RL1 includes silicon oxide, and the second residual layer RL2 includes silicon oxynitride.

In some embodiments, the first residual layer RL1 and the first inter layer IL1 are in a same layer; the second residual layer RL2 and the second inter layer IL2 are in a same layer; and the first residual encapsulating layer REN1 and the second residual encapsulating layer REN2 are in a same layer as the encapsulating layer EN.

In some embodiments, the first residual layer RL1, the second residual layer RL2, and the second residual encapsulating layer REN2 form a stacked structure. In one example, in a cross-section along a plane intersecting adjacent encapsulated units of the plurality of encapsulated units EU and perpendicular to a surface of the second base substrate BS2 (e.g., the cross-section shown in FIG. 6, FIG. 7, or FIG. 12A), the stacked structure has T shape.

In some embodiments, in a cross-section along a plane intersecting adjacent encapsulated units of the plurality of encapsulated units EU and perpendicular to a surface of the second base substrate BS2 (e.g., the cross-section shown in FIG. 6, FIG. 7, or FIG. 12A), the structure comprising the first residual layer RL1 and the second residual layer RL2 have a T shape. Optionally, the T shape stacked structure is formed by depositing a first inter material layer on the second base substrate BS2 and depositing a second inter material layer on a side of the first inter material layer away from the second base substrate BS2; etching the first inter material layer and the second inter material layer using a same etchant. The first inter material layer and the second inter material layer are etched differently due to the different etch selectivity between the first inter material layer and the second inter material layer. An undercut structure is formed upon etching the first inter material layer and the second inter material layer using the same etchant, thereby forming the T shape structure. An encapsulating material is then deposited on the substrate. Due to the presence of the T shape structure comprising the first residual layer RL1 and the second residual layer RL2, the encapsulating material deposited on the substrate is segregated into at least the encapsulating layer EN, the first residual encapsulating layer REN1, and the second residual encapsulating layer REN2. The encapsulating layer EN, the first residual encapsulating layer REN1, and the second residual encapsulating layer REN2 are at least partially segregated from each other.

Figure 13:
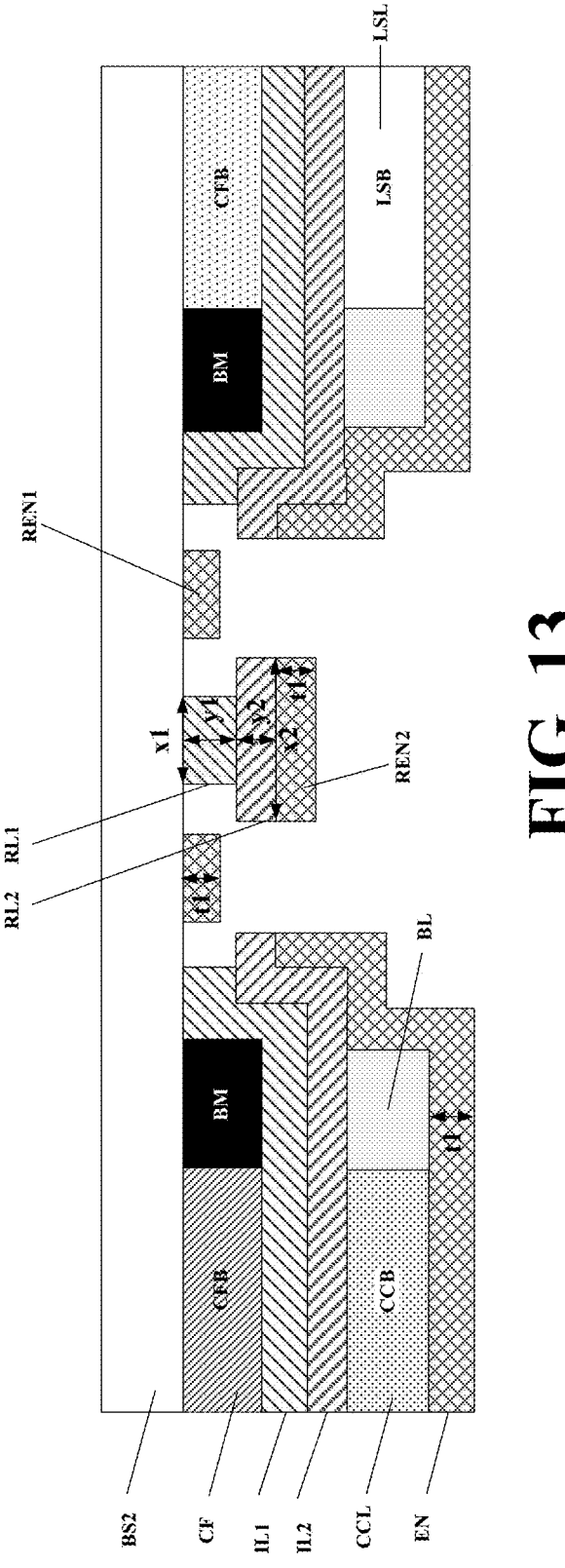
FIG. 13 is a schematic diagram illustrating the structure of a portion of a first color conversion substrate in some embodiments according to the present disclosure.

FIG. 13 is a schematic diagram illustrating the structure of a portion of a first color conversion substrate in some embodiments according to the present disclosure. Referring to FIG. 13, in some embodiments, the encapsulating layer EN, the first residual encapsulating layer REN1, or the second residual encapsulating layer REN2 has a thickness t1; the second residual layer RL2 has a thickness y2; and the first residual layer RL1 has a thickness y1.

In some embodiments, y1 is greater than t1. In one example, t1 is 0.8 μm, and y1 is in a range of 1.0 μm to 1.5 μm. In another example, when the second residual layer RL2 includes silicon nitride or silicon oxynitride, y2 is in a range of 0.2 μm to 0.6 μm. In another example, when the second residual layer RL2 includes aluminum oxide, y2 is in a range of 0.03 μm to 0.15 μm.

In some embodiments, in a cross-section along a plane intersecting adjacent encapsulated units of the plurality of encapsulated units EU and perpendicular to a surface of the second base substrate BS2 (e.g., the cross-section shown in FIG. 6, FIG. 7, FIG. 12A, or FIG. 13), the first residual layer RL1 has a width x1; and the second residual encapsulating layer REN2 has a width x2.

In some embodiments, x2 is greater than x1. In one example, x2 is greater than x1 by at least 0.3 μm, e.g., by 0.3 μm to 1.0 μm.

Figure 14:
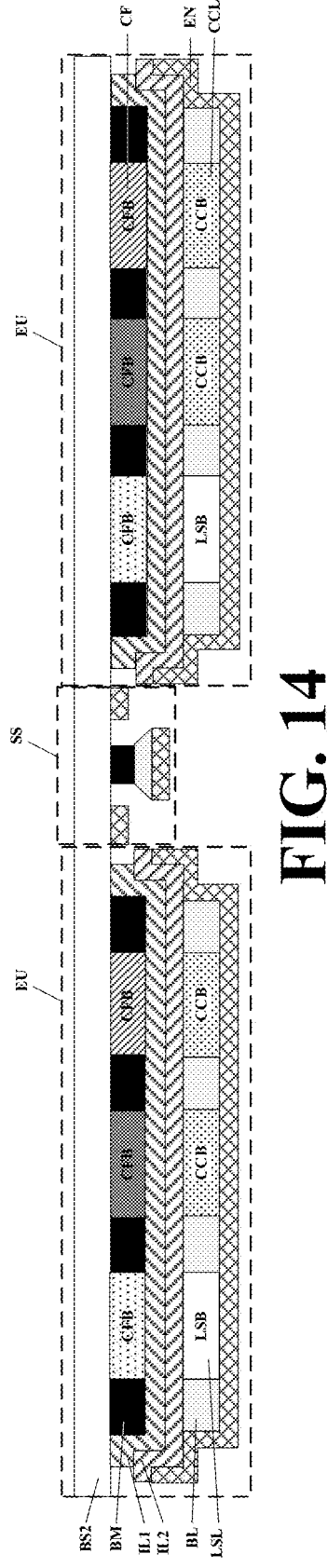
FIG. 14 is a schematic diagram illustrating the structure of a portion of a first color conversion substrate in some embodiments according to the present disclosure.
Figure 15:
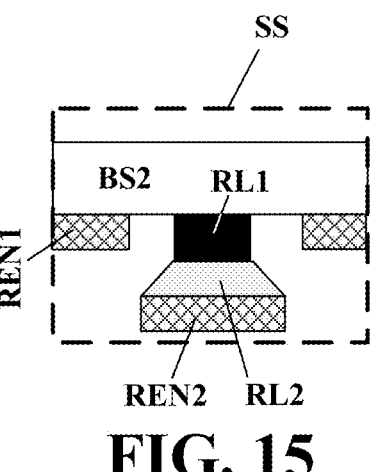
FIG. 15 is a cross-sectional view of a separation structure in some embodiments according to the present disclosure.

Various appropriate implementations may be practiced in the present disclosure. FIG. 14 is a schematic diagram illustrating the structure of a portion of a first color conversion substrate in some embodiments according to the present disclosure. FIG. 15 is a cross-sectional view of a separation structure in some embodiments according to the present disclosure. Referring to FIG. 14 and FIG. 15, the separation structure in some embodiments includes a first residual encapsulating layer REN1. Optionally, the first residual encapsulating layer REN1 is on the second base substrate BS2. In one example, the first residual encapsulating layer REN1 is in direct contact with the second base substrate BS2. Optionally, the first residual encapsulating layer REN1 substantially surrounds a respective encapsulated unit of the plurality of encapsulated units EU. In some embodiments, the first residual encapsulating layer REN1 includes a plurality of rings. A respective ring of the plurality of rings substantially surrounds the respective encapsulated unit of the plurality of encapsulated units EU. The respective ring is spaced apart from the respective encapsulated unit.

In some embodiments, the separation structure further includes a second residual encapsulating layer REN2. The second residual encapsulating layer REN2 is in a region between adjacent encapsulated units of the plurality of encapsulated units EU. Optionally, the second residual encapsulating layer REN2 substantially surrounds the respective encapsulated unit of the plurality of encapsulated units EU. In one example depicted in FIG. 14 and FIG. 15, the second residual encapsulating layer REN2 is a network continuously extending throughout the region between adjacent encapsulated units of the plurality of encapsulated units EU.

In some embodiments, the separation structure further includes a second residual layer RL2. The second residual layer RL2 is in a region between adjacent encapsulated units of the plurality of encapsulated units EU. Optionally, the second residual layer RL2 substantially surrounds the respective encapsulated unit of the plurality of encapsulated units EU. In one example depicted in FIG. 14 and FIG. 15, the second residual layer RL2 is a network continuously extending throughout the region between adjacent encapsulated units of the plurality of encapsulated units EU.

In some embodiments, the separation structure further includes a first residual layer RL1. The first residual layer RL1 is in a region between adjacent encapsulated units of the plurality of encapsulated units EU. Optionally, the first residual layer RL1 substantially surrounds the respective encapsulated unit of the plurality of encapsulated units EU. In one example depicted in FIG. 14 and FIG. 15, the first residual layer RL1 is a network continuously extending throughout the region between adjacent encapsulated units of the plurality of encapsulated units EU.

In some embodiments, the first residual layer RL1 and the black matrix BM are in a same layer; the second residual layer RL2 and the bank layer BL are in a same layer; and the first residual encapsulating layer REN1 and the second residual encapsulating layer REN2 are in a same layer as the encapsulating layer EN.

In some embodiments, the first residual layer RL1, the second residual layer RL2, and the second residual encapsulating layer REN2 form a stacked structure. In one example, in a cross-section along a plane intersecting adjacent encapsulated units of the plurality of encapsulated units EU and perpendicular to a surface of the second base substrate BS2 (e.g., the cross-section shown in FIG. 14 and FIG. 15), the stacked structure has substantially T shape.

In some embodiments, in the cross-section along a plane intersecting adjacent encapsulated units of the plurality of encapsulated units EU and perpendicular to a surface of the second base substrate BS2, the second residual layer RL2 has a trapezoidal shape. In one example, the second residual layer RL2 is made of a negative photoresist, and may be developed to have a trapezoidal shape.

In some embodiments, an orthographic projection of the first residual encapsulating layer REN1 (e.g., the plurality of rings) on a base substrate (e.g., the second base substrate BS2) is substantially non-overlapping with an orthographic projection of the second residual encapsulating layer REN2 on the base substrate. Optionally, the orthographic projection of the first residual encapsulating layer REN1 on the base substrate is completely non-overlapping with the orthographic projection of the second residual encapsulating layer REN2 on the base substrate.

In some embodiments, an orthographic projection of the first residual encapsulating layer REN1 (e.g., the plurality of rings) on a base substrate (e.g., the second base substrate BS2) is substantially non-overlapping with an orthographic projection of the second residual layer RL2 on the base substrate. Optionally, the orthographic projection of the first residual encapsulating layer REN1 on the base substrate is completely non-overlapping with the orthographic projection of the second residual layer RL2 on the base substrate.

In some embodiments, an orthographic projection of the first residual encapsulating layer REN1 (e.g., the plurality of rings) on a base substrate (e.g., the second base substrate BS2) is substantially non-overlapping with an orthographic projection of the first residual layer RL1 on the base substrate. Optionally, the orthographic projection of the first residual encapsulating layer REN1 on the base substrate is completely non-overlapping with the orthographic projection of the first residual layer RL1 on the base substrate.

In FIG. 12A, the first residual layer RL1 and the first inter layer IL1 are in a same layer; the second residual layer RL2 and the second inter layer IL2 are in a same layer. In FIG. 15, the first residual layer RL1 and the black matrix BM are in a same layer; the second residual layer RL2 and the bank layer BL are in a same layer. Various alternative implementations may be practiced in the present disclosure. In another example, the first residual layer RL1 may be in a same layer as any one of the black matrix BM, the first inter layer ILL or the second inter layer IL2; and the second residual layer RL2 may be in a same layer as any one of the first inter layer ILL the second inter layer IL2, or the bank layer BL. In another example, the separation structure SS may include more than two residual layers (e.g., three or four or more residual layers). In another example, the separation structure SS includes a first residual layer on the second base substrate BS2 and in a same layer as the black matrix BM; a second residual layer on a side of the first residual layer away from the second base substrate BS2 and in a same layer as the first inter layer IL1; a third residual layer on a side of the second residual layer away from the second base substrate BS2 and in a same layer as the second inter layer IL2, and a fourth residual layer on a side of the third residual layer away from the second base substrate BS2 and in a same layer as the bank layer BL. In another example, the separation structure SS includes three residual layers selected from the group consisting of a first residual layer on the second base substrate BS2 and in a same layer as the black matrix BM; a second residual layer on a side of the first residual layer away from the second base substrate BS2 and in a same layer as the first inter layer IL1; a third residual layer on a side of the second residual layer away from the second base substrate BS2 and in a same layer as the second inter layer IL2, and a fourth residual layer on a side of the third residual layer away from the second base substrate BS2 and in a same layer as the bank layer BL. In another example, the separation structure SS includes two residual layers selected from the group consisting of a first residual layer on the second base substrate BS2 and in a same layer as the black matrix BM; a second residual layer on a side of the first residual layer away from the second base substrate BS2 and in a same layer as the first inter layer IL1; a third residual layer on a side of the second residual layer away from the second base substrate BS2 and in a same layer as the second inter layer IL2, and a fourth residual layer on a side of the third residual layer away from the second base substrate BS2 and in a same layer as the bank layer BL.

Figures 16A, 16B, 16C:
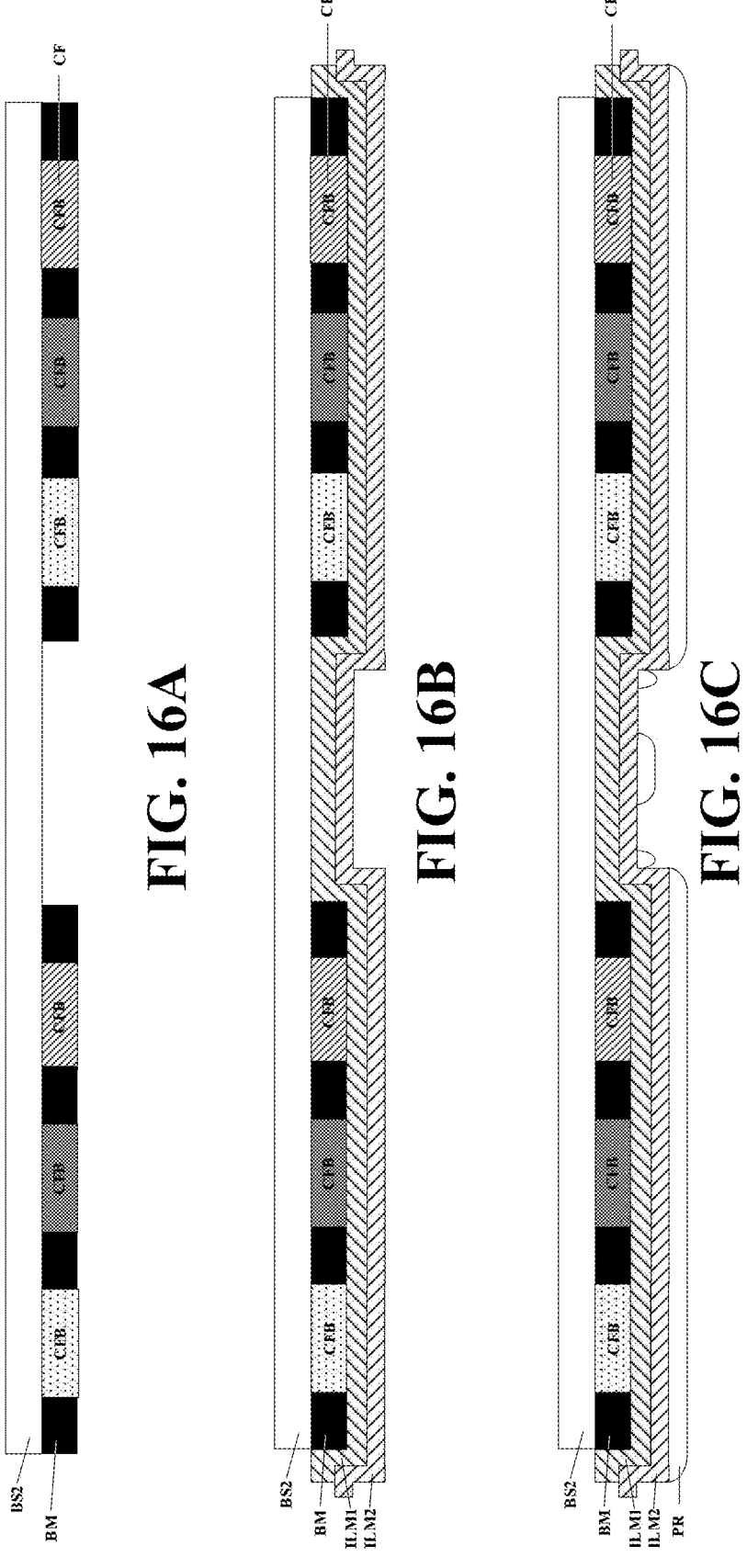
FIG. 16A to FIG. 16G illustrate a process of fabricate a display panel in some embodiments according to the present disclosure.

FIG. 16A to FIG. 16G illustrate a process of fabricate a display panel in some embodiments according to the present disclosure. Referring to FIG. 16A, a black matrix BM and a color filter CF are formed on a second base substrate BS2. The step of forming the color filter CF includes forming a plurality of color filter blocks CFB, e.g., a red color filter block, a green color filter block, and a blue color filter block. Optionally, a respective color filter block of the plurality of color filter blocks CFB is formed at least partially in a light transmissive region. Optionally, the black matrix BM is formed in a light block region.

Referring to FIG. 16B, a first inter material layer ILM1 is formed on a side of the black matrix BM and the color filter CF away from the second base substrate BS2; a second inter material layer ILM2 is formed on a side of the first inter material layer ILM1 away from the second base substrate BS2. In one example, the first inter material layer ILM1 and/or the second inter material layer ILM2 is formed using a chemical vapor deposition process (for example, for depositing silicon oxide, silicon nitride, or silicon oxynitride). In another example, the first inter material layer ILM1 and/or the second inter material layer ILM2 is formed using an atomic layer deposition process (for example, for depositing aluminum oxide).

Referring to FIG. 16C, a photoresist layer PR is formed on a side of the second inter material layer ILM2 away from the first inter material layer ILM1. The photoresist layer PR is formed to cover regions corresponding to the encapsulating layer EN and the second residual encapsulating layer REN2 according to FIG. 6 or FIG. 7. The photoresist layer PR is absent in a region corresponding to the first residual encapsulating layer REN1 according to FIG. 6 or FIG. 7.

Figures 16D, 16E, 16F:
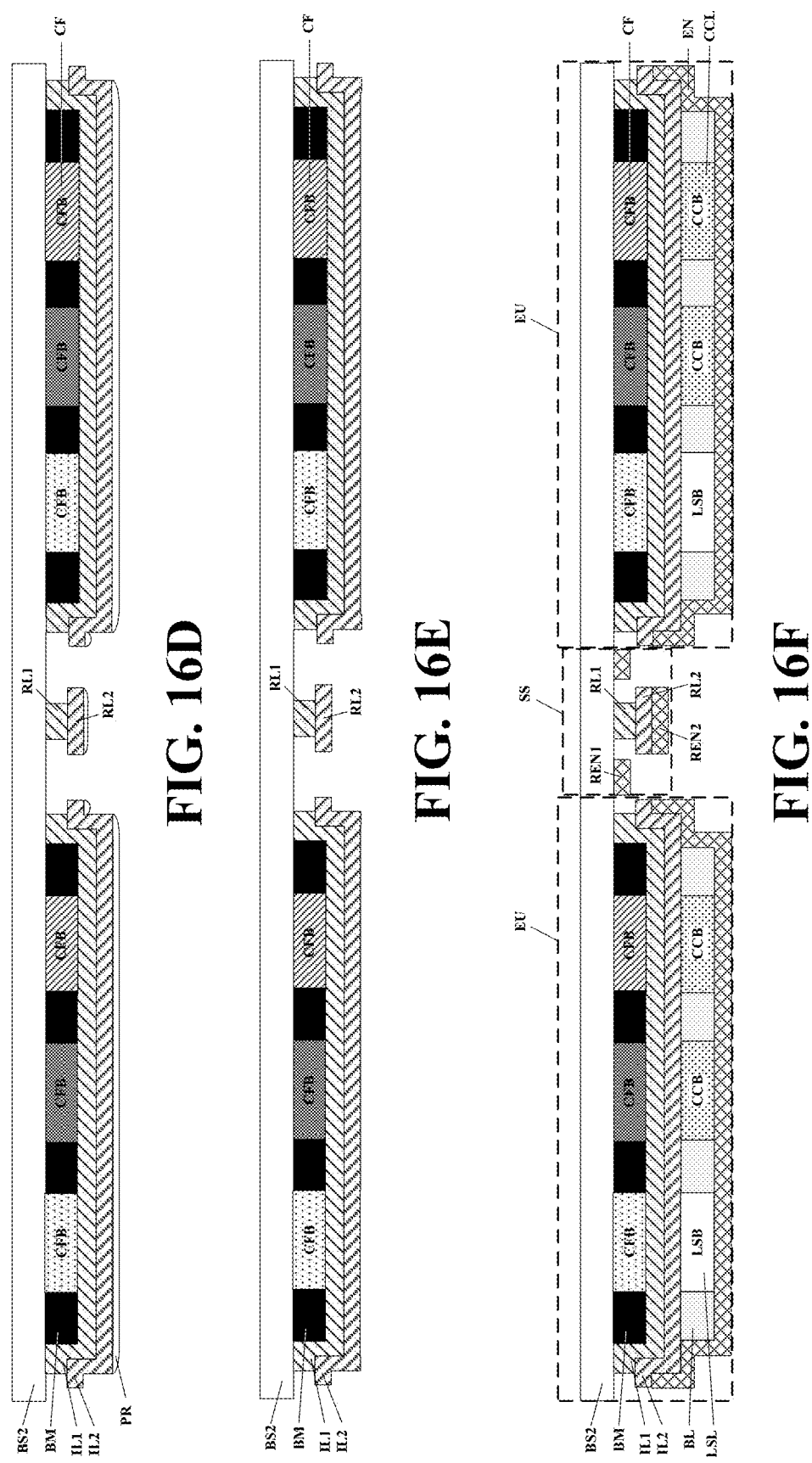

Referring to FIG. 16D, using the photoresist layer PR as a mask plate, the first inter material layer ILM1 and the second inter material layer ILM2 are etched to form a first inter layer IL1 and a second inter layer IL2. In the region corresponding to the second residual encapsulating layer REN2 according to FIG. 6 or FIG. 7, a first residual layer RL1 and a second residual layer RL2 are formed. As discussed above, the first inter material layer ILM1 and the second inter material layer ILM2 have different etching selectivity. An undercut structure is formed underneath the portion of the photoresist layer PR in the region corresponding to the second residual encapsulating layer REN2 according to FIG. 6 or FIG. 7. A portion of the first inter material layer ILM1 underneath the portion of the photoresist layer PR is relatively more etched than a portion of the second residual layer RL2 underneath the portion of the photoresist layer PR, thereby formed a T shape stacked structure comprising the first residual layer RL1 and the second residual layer RL2.

Referring to FIG. 16E, the photoresist layer PR is removed.

Referring to FIG. 16F, an encapsulating material is deposited on the substrate. Due to the presence of the T shape structure comprising the first residual layer RL1 and the second residual layer RL2, the encapsulating material deposited on the substrate is segregated into at least the encapsulating layer EN, the first residual encapsulating layer REN1, and the second residual encapsulating layer REN2. The encapsulating layer EN, the first residual encapsulating layer REN1, and the second residual encapsulating layer REN2 are at least partially segregated from each other.

Figure 16G:
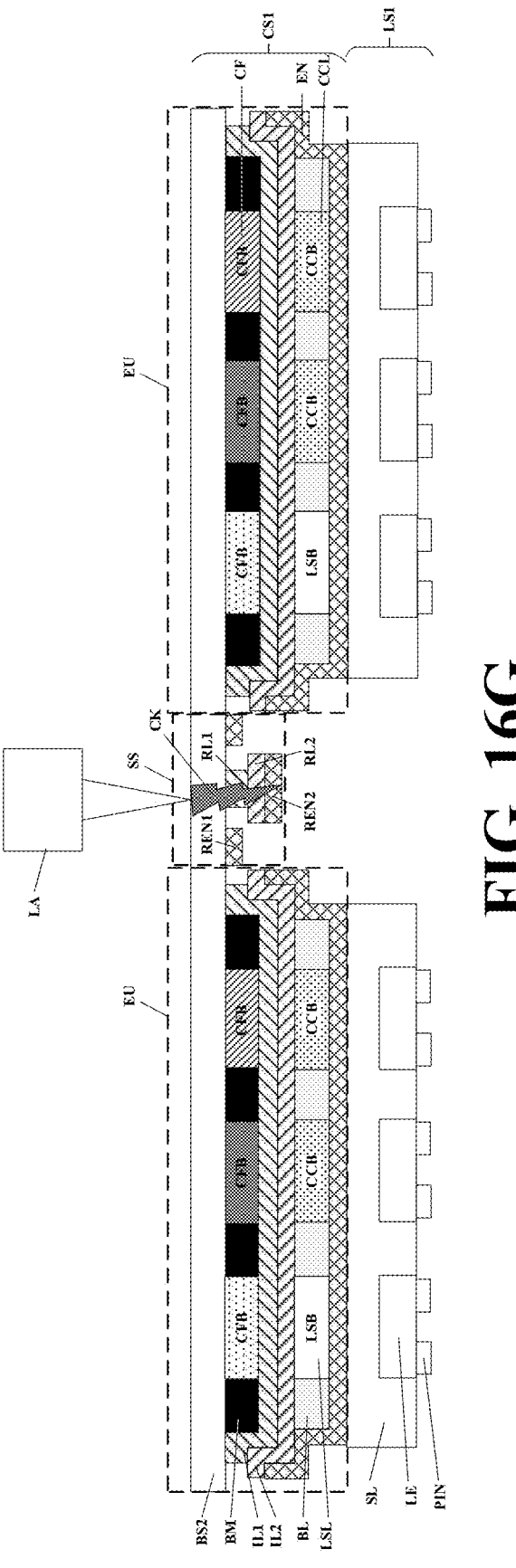

Referring to FIG. 16G, a first light emitting element substrate LS1 is assembled with a first color conversion substrate CS1. Optionally, the first light emitting element substrate LS1 is attached to the first color conversion substrate CS1 through a sealant layer SL. Optionally, prior to assembling the first light emitting element substrate LS1 with the first color conversion substrate CS1, a color conversion mother substrate fabricated according to FIG. 16A to FIG. 16F is subject to a 1$^{st}$ cut process depicted in FIG. 2A.

Subsequent to assembling the light emitting element substrate LS1 with the color conversion substrate CS, a laser LA is used for cutting the color conversion substrate CS (e.g., during the "$2^{nd}$ cut", in which the color conversion substrate CS is a first intermediate substrate IS1 depicted in FIG. 2B). A crack CK occurs during the cut. Because the first residual encapsulating layer REN1 and the second residual encapsulating layer REN2 are both segregated from the encapsulating layer EN, the first residual layer RL1 is segregated from the first inter layer ILL and the second residual layer RL2 is segregated from the second inter layer IL2, the crack CK is limited to the cut region. The crack CK does not propagate into other regions (e.g., regions having color conversion blocks) of the color conversion substrate CS, leaving the encapsulation in the plurality of encapsulated units EU intact.

Figure 17:
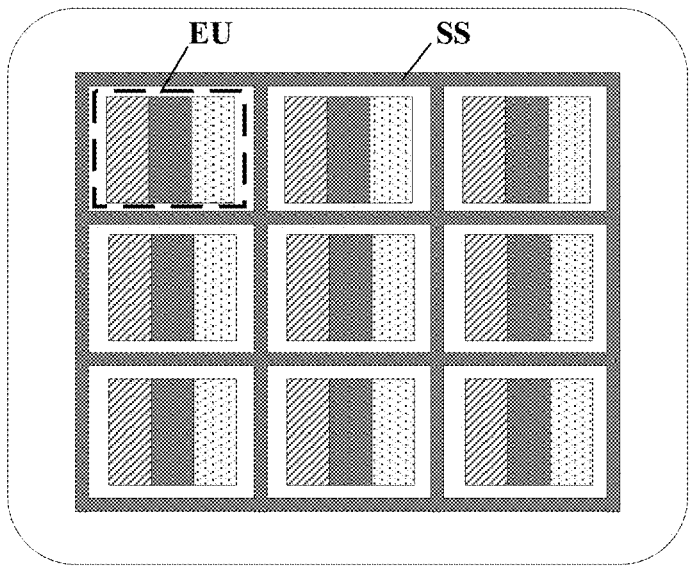
FIG. 17 is a schematic diagram illustrating the structure of a portion of a first intermediate substrate in some embodiments according to the present disclosure.
Figure 18:
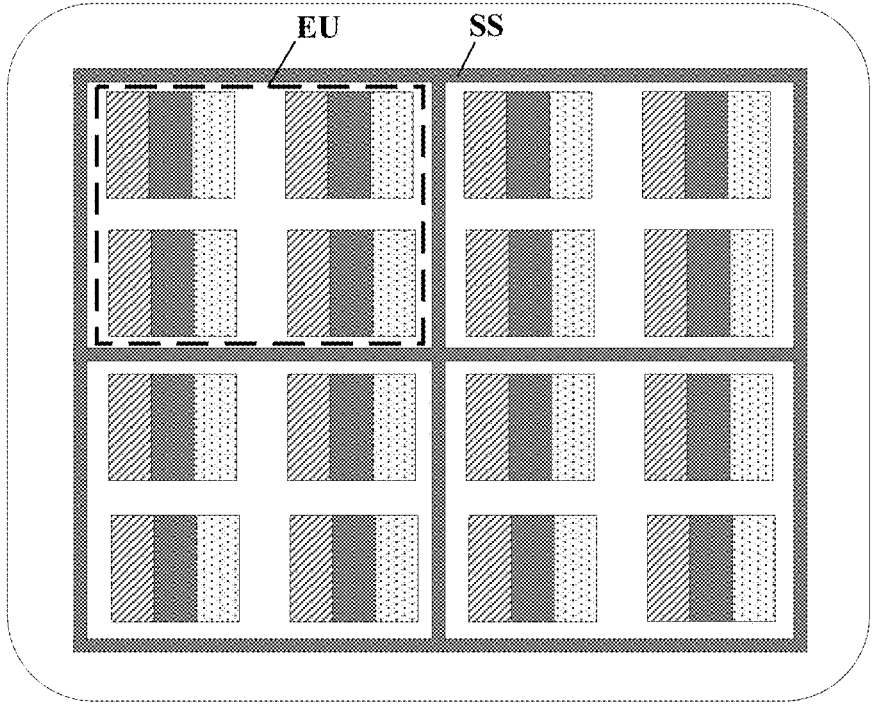
FIG. 18 is a schematic diagram illustrating the structure of a portion of a first intermediate substrate in some embodiments according to the present disclosure.

Referring to FIG. 16F, the separation structure SS is formed between adjacent encapsulated units of the plurality of encapsulated units EU. Various appropriate implementations may be practiced in the present disclosure. FIG. 17 is a schematic diagram illustrating the structure of a portion of a first intermediate substrate in some embodiments according to the present disclosure. Referring to FIG. 17, in some embodiments, a respective encapsulated unit of the plurality of encapsulated units EU includes a single pixel, e.g., three subpixels (red subpixel, green subpixel, and blue subpixel). FIG. 18 is a schematic diagram illustrating the structure of a portion of a first intermediate substrate in some embodiments according to the present disclosure. Referring to FIG. 18, in some embodiments, a respective encapsulated unit of the plurality of encapsulated units EU includes multiple pixels, each pixel including three subpixels (red subpixel, green subpixel, and blue subpixel).

In another aspect, the present disclosure provides a substrate comprising a color conversion substrate and a light emitting element substrate. In some embodiments, the substrate is an intermediate substrate, e.g., the second intermediate substrate IS2 depicted in FIG. 2B subsequent to the $2^{nd}$ cut process. During the $2^{nd}$ cut process, the separation structure is partially or completely cut.

Figure 19:
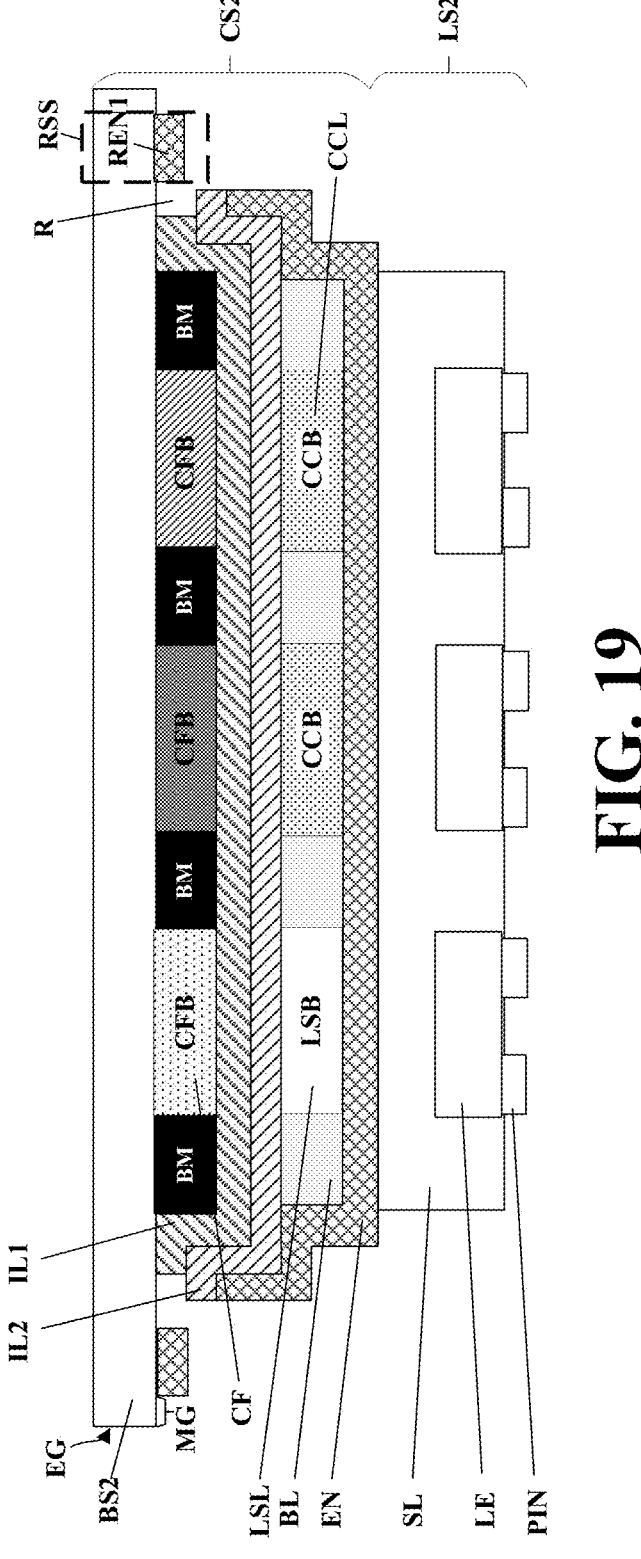
FIG. 19 is a schematic diagram illustrating the structure of a portion of a second intermediate substrate in some embodiments according to the present disclosure.
Figure 20:
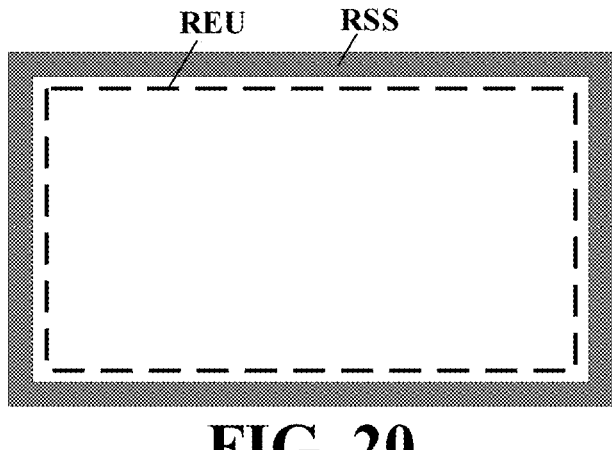
FIG. 20 is a plan view of a second color conversion substrate in a second intermediate substrate in some embodiments according to the present disclosure.
Figure 21:
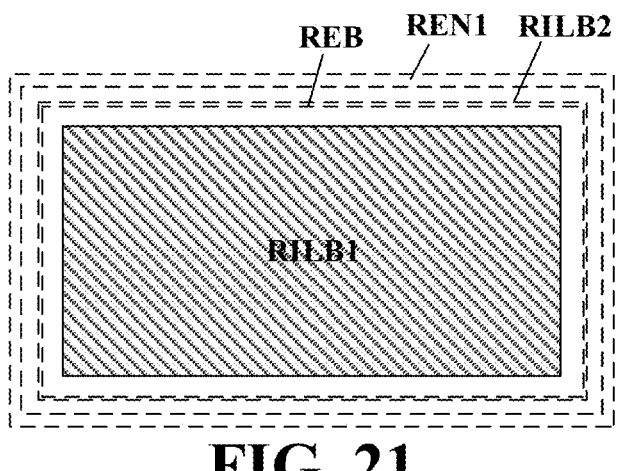
FIG. 21 is a schematic diagram illustrating a respective first inter layer block in a second color conversion substrate in a second intermediate substrate in some embodiments according to the present disclosure.
Figure 22:
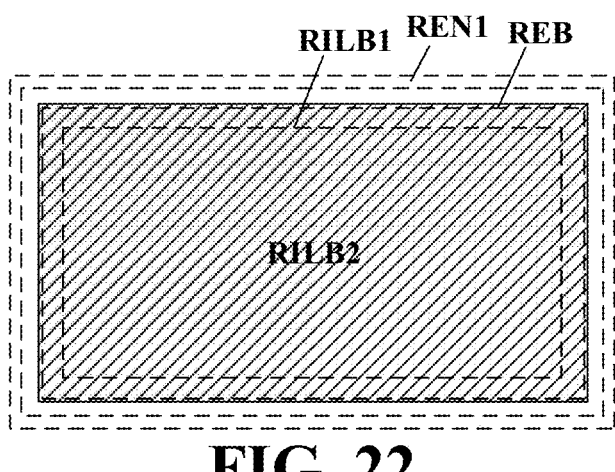
FIG. 22 is a schematic diagram illustrating a respective second inter layer block in a second color conversion substrate in a second intermediate substrate in some embodiments according to the present disclosure.
Figure 23:
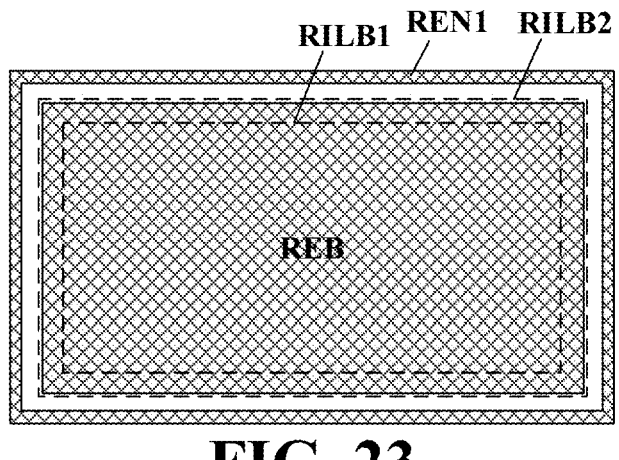
FIG. 23 is a schematic diagram illustrating a respective encapsulating block and a first residual encapsulating layer in a second color conversion substrate in a second intermediate substrate in some embodiments according to the present disclosure.
Figure 24:
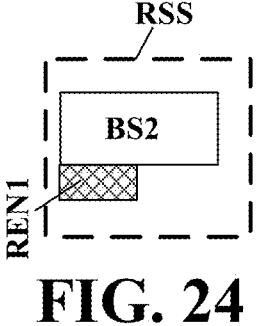
FIG. 24 is a cross-sectional view of a residual separation structure in a second intermediate substrate in some embodiments according to the present disclosure.

FIG. 19 is a schematic diagram illustrating the structure of a portion of a second intermediate substrate in some embodiments according to the present disclosure. FIG. 20 is a plan view of a second color conversion substrate in a second intermediate substrate in some embodiments according to the present disclosure. FIG. 21 is a schematic diagram illustrating a respective first inter layer block in a second color conversion substrate in a second intermediate substrate in some embodiments according to the present disclosure. FIG. 22 is a schematic diagram illustrating a respective second inter layer block in a second color conversion substrate in a second intermediate substrate in some embodiments according to the present disclosure. FIG. 23 is a schematic diagram illustrating a respective encapsulating block in a second color conversion substrate in a second intermediate substrate in some embodiments according to the present disclosure. FIG. 24 is a cross-sectional view of a residual separation structure in a second intermediate substrate in some embodiments according to the present disclosure. FIG. 19 to FIG. 24 correspond to an embodiment in which the T shape structure of the separation structure is removed during the $2^{nd}$ cut process. In FIG. 21, a respective first inter layer block RILB1 is depicted in a block, a boundary of the first residual encapsulating layer REN1 is denoted in dotted lines, a boundary of a respective second inter layer block RILB2 is denoted in dotted lines, and a boundary of a respective encapsulating block REB is denoted in dotted lines. In FIG. 22, a respective second inter layer block RILB2 is depicted in a block, a boundary of the first residual encapsulating layer REN1 is denoted in dotted lines, a boundary of a respective first inter layer block RILB1 is denoted in dotted lines, and a boundary of a respective encapsulating block REB is denoted in dotted lines. In FIG. 23, a respective encapsulating block REB and a first residual encapsulating layer REN1 are depicted in blocks, a boundary of a respective first inter layer block RILB1 is denoted in dotted lines, and a boundary of a respective second inter layer block RILB2 is denoted in dotted lines. The boundary of the respective encapsulating block REB substantially overlaps with the boundary of the respective second inter layer block RILB2.

Referring to FIG. 19 to FIG. 24, the substrate in some embodiments includes a respective encapsulated unit REU. The substrate includes a second color conversion substrate CS2 and a second light emitting element substrate LS2 assembled together.

In some embodiments, the second light emitting element substrate LS2 includes a plurality of contact pins PIN and a plurality of light emitting elements LE. In the second light emitting element substrate LS2, a respective light emitting element of the plurality of light emitting elements LE is electrically connected to at least one of the plurality of contact pads PAD. When the display panel is assembled, a respective contact pin of the plurality of contact pins PIN is electrically connected to an individual contact pad of the plurality of contact pads PAD.

In some embodiments, the second light emitting element substrate LS2 further includes a sealant layer SL on a side of the plurality of light emitting elements LE away from the plurality of contact pins PIN. When the display panel is assembled, the sealant layer SL attaches the second light emitting element substrate LS2 and the second color conversion substrate CS2 together.

In some embodiments, the second color conversion substrate CS2 includes a second base substrate BS2, a black matrix BM and a color filter CF on the second base substrate BS2. The color filter CF in some embodiments includes a plurality of color filter blocks CFB. For example, the plurality of color filter blocks CFB include a red color filter block, a green color filter block, and a blue color filter block. Optionally, a respective color filter block of the plurality of color filter blocks CFB is at least partially in a light transmissive region. Optionally, the black matrix BM is in a light block region.

In some embodiments, the second color conversion substrate CS2 further includes a first inter layer IL1 on a side of the black matrix BM and the color filter CF away from the second base substrate BS2; a second inter layer IL2 on a side of the first inter layer IL1 away from the second base substrate BS2; a bank layer BL, a color conversion layer CCL, and a light scattering layer LSL on a side of the second inter layer IL2 away from the second base substrate BS2; and an encapsulating layer EN on a side of the bank layer BL, the color conversion layer CCL, and the light scattering layer LSL away from the second base substrate BS2. Optionally, the color conversion layer CCL includes a plurality of color conversion blocks CCB, a respective color conversion block of the plurality of color conversion blocks CCB being at least partially in an individual light transmissive region. Optionally, the light scattering layer LSL includes a plurality of light scattering blocks LSB, a respective light scattering block of the plurality of light scattering blocks LSB being at least partially in an individual light transmissive region. The encapsulating layer EN encapsulates the color conversion layer CCL and the light scattering layer LSL to prevent air or moisture from entering the first color conversion substrate CS1. The black matrix BM and the color filter CF prevents excitation of the color conversion material by external light.

In some embodiments, the encapsulating layer EN includes a respective encapsulating block REB in the respective encapsulated unit REU. In some embodiments, the second inter layer IL2 includes a respective second inter layer block RILB2 in the respective encapsulated unit REU. In some embodiments, the first inter layer IL1 includes a respective first inter layer block RILB1 in the respective encapsulated unit REU.

In some embodiments, the second color conversion substrate CS2 includes a residual separation structure RSS substantially surrounding the respective encapsulated unit REU. The encapsulated unit REU and the residual separation structure RSS are on the second base substrate BS2.

In some embodiments, the encapsulating layer EN is at least partially absent in a peripheral region around the respective encapsulated unit REU. In some embodiments, the second base substrate BS2 is at least partially uncovered, e.g., by the encapsulating layer EN in the peripheral region around the respective encapsulated unit REU.

In some embodiments, the encapsulating layer EN and the first residual encapsulating layer REN1 are at least partially absent in the peripheral region around the respective encapsulated unit REU. In some embodiments, the second base substrate BS2 is at least partially uncovered, e.g., by the encapsulating layer EN or the first residual encapsulating layer REN1 in the peripheral region around the respective encapsulated unit REU.

In some embodiments, the second inter layer IL2 is at least partially absent in the peripheral region around the respective encapsulated unit REU. In some embodiments, the second base substrate BS2 is at least partially uncovered, e.g., by the second inter layer IL2 in the peripheral region around the respective encapsulated unit REU.

In some embodiments, the first inter layer IL1 is at least partially absent in the peripheral region around the respective encapsulated unit REU. In some embodiments, the second base substrate BS2 is at least partially uncovered, e.g., by the first inter layer IL1 in the In some embodiments, the respective encapsulated unit REU includes a recess R at least partially exposing a surface of the second base substrate BS2. In one example, the recess R is at least partially surrounded respectively by sides of the first inter layer IL1 and the second inter layer IL2. In another example, the recess R is at least partially surrounded by sides respectively of the first residual encapsulating layer REN1 and the first inter layer IL1. In another example, the recess R is at least partially surrounded by sides respectively of the first residual encapsulating layer REN1, the first inter layer ILL and the second inter layer IL2.

In some embodiments, the residual separation structure RSS includes a first residual encapsulating layer REN1. Optionally, the first residual encapsulating layer REN1 is on the second base substrate BS2. In one example, the first residual encapsulating layer REN1 is in direct contact with the second base substrate BS2. Optionally, the first residual encapsulating layer REN1 substantially surrounds the respective encapsulated unit REU. Optionally, the first residual encapsulating layer REN1 includes a respective ring substantially surrounding the respective encapsulated unit REU.

Figure 25:
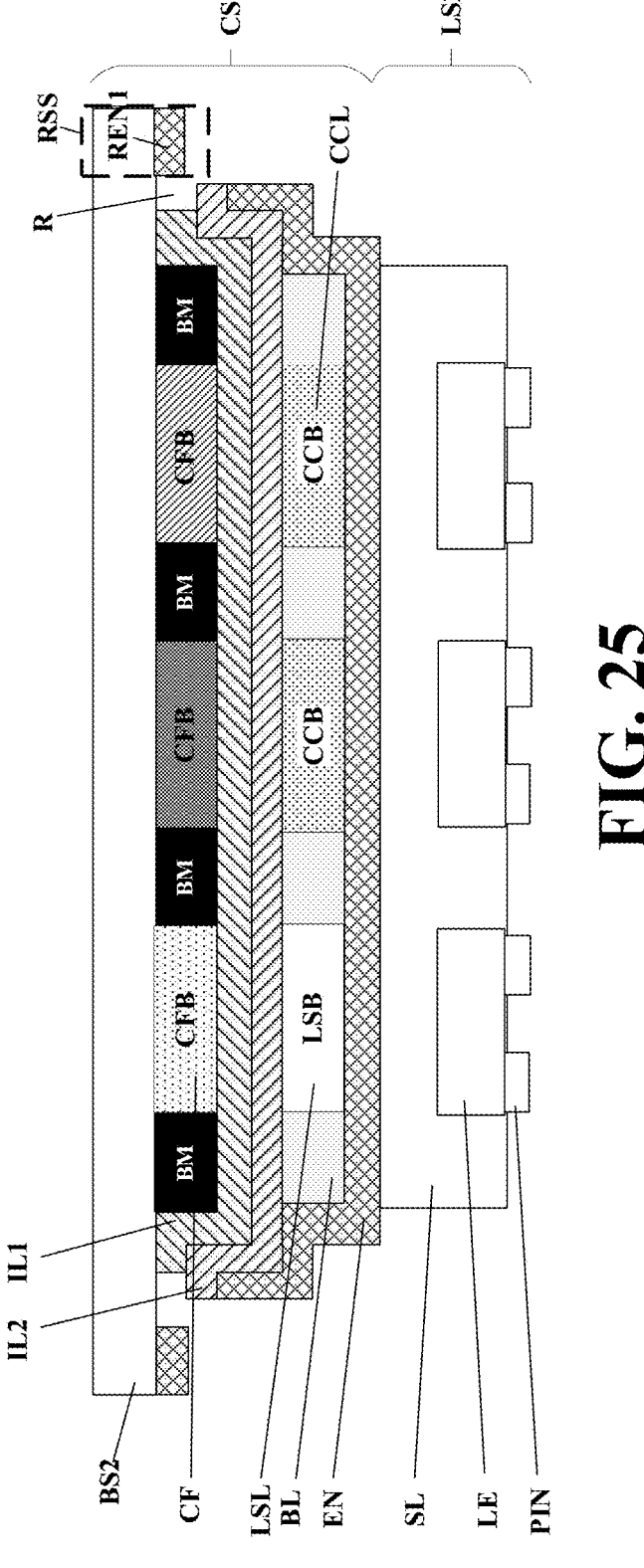
FIG. 25 is a schematic diagram illustrating the structure of a portion of a second intermediate substrate in some embodiments according to the present disclosure.

In FIG. 19, an edge EG of the second base substrate BS2 extends over an edge of the first residual encapsulating layer REN1 by a margin MG, e.g., the edge EG of the second base substrate BS2 is spaced apart from an edge of the first residual encapsulating layer REN1 by a margin MG that is greater than zero. FIG. 25 is a schematic diagram illustrating the structure of a portion of a second intermediate substrate in some embodiments according to the present disclosure. Referring to FIG. 25, an edge of the second base substrate BS2 does not extend over the edge of the first residual encapsulating layer REN1 by a margin. For example, the edge of the second base substrate BS2 and the edge of the first residual encapsulating layer REN1 are substantially co-planar.

Figure 26:
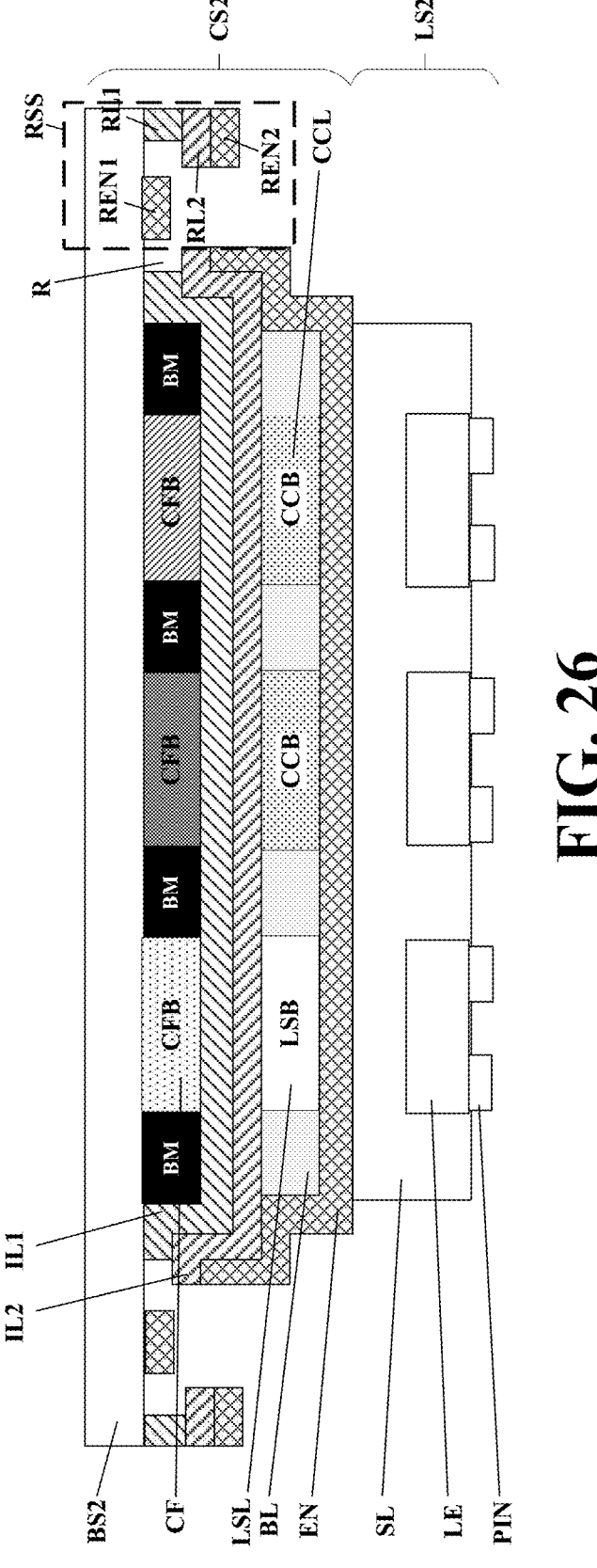
FIG. 26 is a schematic diagram illustrating the structure of a portion of a second intermediate substrate in some embodiments according to the present disclosure.
Figure 27:
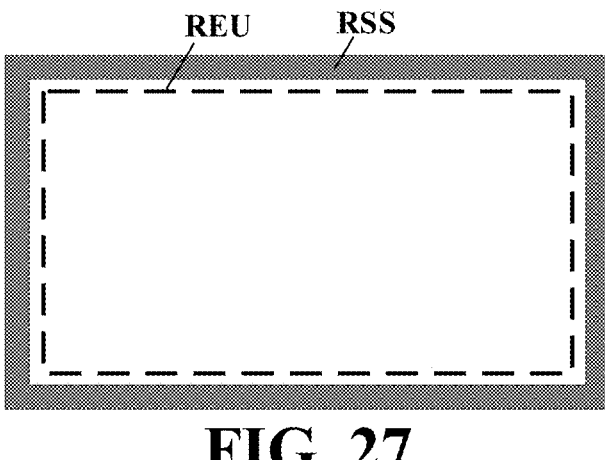
FIG. 27 is a plan view of a second color conversion substrate in a second intermediate substrate in some embodiments according to the present disclosure.
Figure 28:
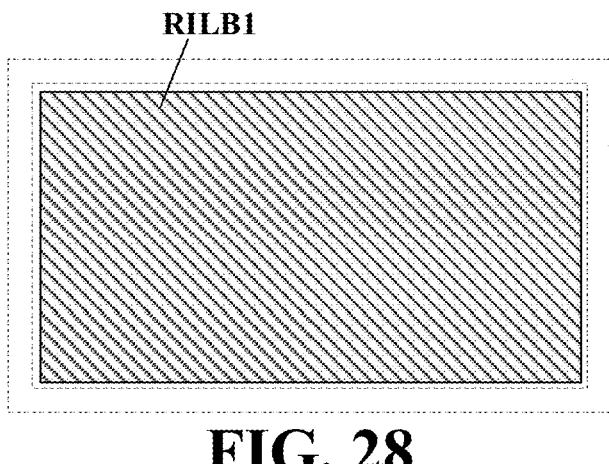
FIG. 28 is a schematic diagram illustrating a respective first inter layer block in a second color conversion substrate in a second intermediate substrate in some embodiments according to the present disclosure.
Figure 29:
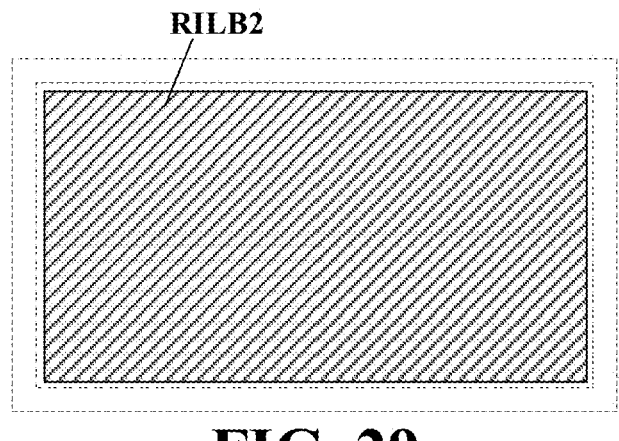
FIG. 29 is a schematic diagram illustrating a respective second inter layer block in a second color conversion substrate in a second intermediate substrate in some embodiments according to the present disclosure.
Figure 30:
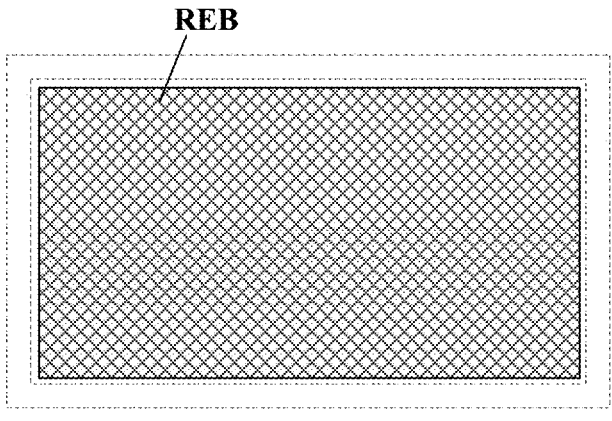
FIG. 30 is a schematic diagram illustrating a respective encapsulating block in a second color conversion substrate in a second intermediate substrate in some embodiments according to the present disclosure.
Figure 31:
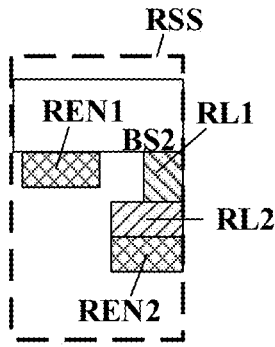
FIG. 31 is a cross-sectional view of a residual separation structure in a second intermediate substrate in some embodiments according to the present disclosure.
Figure 32:
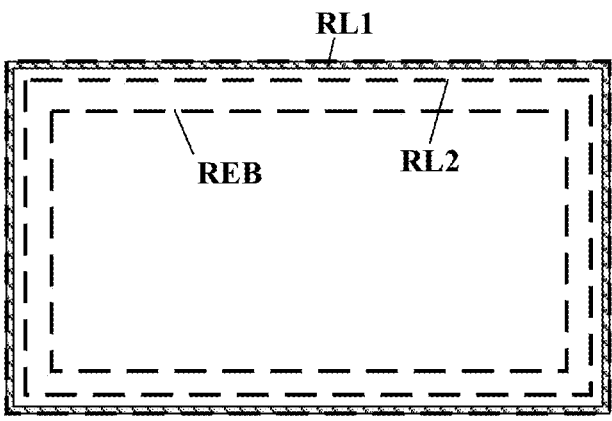
FIG. 32 is a plan view of a first residual encapsulating layer and a second residual encapsulating layer in some embodiments according to the present disclosure.
Figure 33:
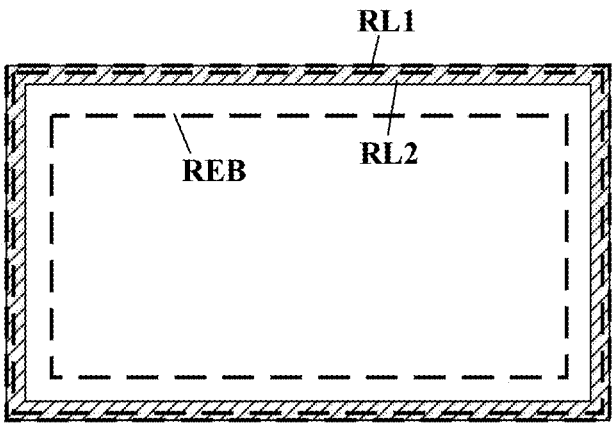
FIG. 33 is a plan view of a second residual layer in some embodiments according to the present disclosure.
Figure 34:
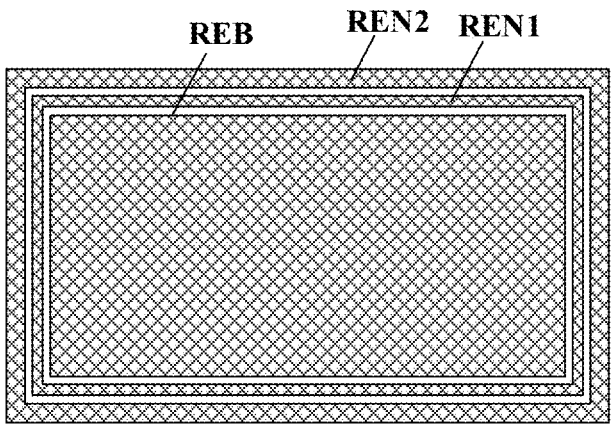
FIG. 34 is a plan view of a first residual layer and a second residual encapsulating layer in some embodiments according to the present disclosure.

FIG. 26 is a schematic diagram illustrating the structure of a portion of a second intermediate substrate in some embodiments according to the present disclosure. FIG. 27 is a plan view of a second color conversion substrate in a second intermediate substrate in some embodiments according to the present disclosure. FIG. 28 is a schematic diagram illustrating a respective first inter layer block in a second color conversion substrate in a second intermediate substrate in some embodiments according to the present disclosure. FIG. 29 is a schematic diagram illustrating a respective second inter layer block in a second color conversion substrate in a second intermediate substrate in some embodiments according to the present disclosure. FIG. 30 is a schematic diagram illustrating a respective encapsulating block in a second color conversion substrate in a second intermediate substrate in some embodiments according to the present disclosure. FIG. 31 is a cross-sectional view of a residual separation structure in a second intermediate substrate in some embodiments according to the present disclosure. FIG. 32 is a plan view of a first residual layer in some embodiments according to the present disclosure. FIG. 33 is a plan view of a second residual layer in some embodiments according to the present disclosure. FIG. 34 is a plan view of a first residual encapsulating layer and a second residual encapsulating layer in some embodiments according to the present disclosure. FIG. 26 to FIG. 34 correspond to an embodiment in which the T shape structure of the separation structure is partially removed during the $2^{nd}$ cut process. In FIG. 32, a first residual layer RL1 is depicted in a block, a boundary of a respective encapsulated block REB is denoted in dotted lines, and a boundary of a second residual layer RL2 is denoted in dotted lines. In FIG. 33, a second residual layer RL2 is depicted in a block, a boundary of a first residual layer RL1 is denoted in dotted lines, and a boundary of a respective encapsulated block REB is denoted in dotted lines. In FIG. 34, a respective encapsulating block REB, a first residual encapsulating layer REN1, and a second residual encapsulating layer REN1 are depicted in blocks.

The substrate depicted in FIG. 26 to FIG. 34 differs from the substrate depicted in FIG. 19 to FIG. 24 in that the separation structure is partially removed in FIG. 26 to FIG. 34 whereas the separation structure is completely removed in FIG. 19 to FIG. 24.

Referring to FIG. 26 to FIG. 34, in some embodiments, the second color conversion substrate CS2 includes a residual separation structure RSS substantially surrounding the respective encapsulated unit REU. The encapsulated unit REU and the residual separation structure RSS are on the second base substrate BS2.

In some embodiments, the encapsulating layer EN is at least partially absent in a peripheral region around the respective encapsulated unit REU. In some embodiments, the second base substrate BS2 is at least partially uncovered, e.g., by the encapsulating layer EN in the peripheral region around the respective encapsulated unit REU.

In some embodiments, the encapsulating layer EN and the first residual encapsulating layer REN1 are at least partially absent in the peripheral region around the respective encapsulated unit REU. In some embodiments, the second base substrate BS2 is at least partially uncovered, e.g., by the encapsulating layer EN or the first residual encapsulating layer REN1 in the peripheral region around the respective encapsulated unit REU.

In some embodiments, the second inter layer IL2 is at least partially absent in the peripheral region around the respective encapsulated unit REU. In some embodiments, the second base substrate BS2 is at least partially uncovered, e.g., by the second inter layer IL2 in the peripheral region around the respective encapsulated unit REU.

In some embodiments, the first inter layer IL1 is at least partially absent in the peripheral region around the respective encapsulated unit REU. In some embodiments, the second base substrate BS2 is at least partially uncovered, e.g., by the first inter layer IL1 in the In some embodiments, the respective encapsulated unit REU includes a recess R at least partially exposing a surface of the second base substrate BS2. In one example, the recess R is at least partially surrounded by sides respectively of the first inter layer IL1 and the second inter layer IL2. In another example, the recess R is at least partially surrounded by sides respectively of the first residual encapsulating layer REN1 and the first inter layer IL1. In another example, the recess R is at least partially surrounded by sides respectively of the first residual encapsulating layer REN1, the first inter layer ILL and the second inter layer IL2.

In some embodiments, the residual separation structure RSS includes a first residual encapsulating layer REN1. Optionally, the first residual encapsulating layer REN1 is on the second base substrate BS2. In one example, the first residual encapsulating layer REN1 is in direct contact with the second base substrate BS2. Optionally, the first residual encapsulating layer REN1 substantially surrounds the respective encapsulated unit REU. Optionally, the first residual encapsulating layer REN1 includes a respective ring substantially surrounding the respective encapsulated unit REU.

In some embodiments, the residual separation structure RSS further includes a stacked structure. The stacked structure is on a side of the respective ring of the first residual encapsulating layer REN1 away from the respective encapsulated unit REU. Optionally, the stacked structure substantially surrounds the respective ring of the first residual encapsulating layer REN1, which in turn substantially surrounds the respective encapsulated unit REU. In one example, the stacked structure has an L shape in a cross-section along a plane perpendicular to a surface of the second base substrate BS2 and intersecting the respective encapsulated unit REU, the first residual encapsulating layer REN1, and the second light emitting element substrate LS2 (e.g., the cross-section shown in FIG. 26).

In some embodiments, the separation structure includes a second residual encapsulating layer REN2 as part of the stacked structure. The second residual encapsulating layer REN2 is in a peripheral region around the respective encapsulated unit REU. Optionally, the second residual encapsulating layer REN2 substantially surrounds the first residual encapsulating layer REN1 and the respective encapsulated unit REU. In one example depicted in FIG. 31 to FIG. 34, the second residual encapsulating layer REN2 has a ring shape in plan view of the substrate.

In some embodiments, an orthographic projection of the first residual encapsulating layer REN1 (e.g., the respective ring) on a base substrate (e.g., the second base substrate BS2) is substantially non-overlapping with an orthographic projection of the second residual encapsulating layer REN2 on the base substrate. Optionally, the orthographic projection of the first residual encapsulating layer REN1 on the base substrate is completely non-overlapping with the orthographic projection of the second residual encapsulating layer REN2 on the base substrate.

In some embodiments, the separation structure further includes a second residual layer RL2. The second residual layer RL2 is in the peripheral region around the respective encapsulated unit REU. Optionally, the second residual layer RL2 substantially surrounds the respective encapsulated unit REU. In one example depicted in FIG. 31 to FIG. 34, the second residual layer RL2 has a ring shape in plan view of the substrate.

In some embodiments, an orthographic projection of the first residual encapsulating layer REN1 (e.g., the respective ring) on a base substrate (e.g., the second base substrate BS2) is substantially non-overlapping with an orthographic projection of the second residual layer RL2 on the base substrate. Optionally, the orthographic projection of the first residual encapsulating layer REN1 on the base substrate is completely non-overlapping with the orthographic projection of the second residual layer RL2 on the base substrate.

In some embodiments, the separation structure further includes a first residual layer RL1. The first residual layer RL1 is in the peripheral region around the respective encapsulated unit REU. Optionally, the first residual layer RL1 substantially surrounds the respective encapsulated unit REU. In one example depicted in FIG. 31 to FIG. 34, the first residual layer RL1 has a ring shape in plan view of the substrate.

In some embodiments, an orthographic projection of the first residual encapsulating layer REN1 (e.g., the respective ring) on a base substrate (e.g., the second base substrate BS2) is substantially non-overlapping with an orthographic projection of the first residual layer RL1 on the base substrate. Optionally, the orthographic projection of the first residual encapsulating layer REN1 on the base substrate is completely non-overlapping with the orthographic projection of the first residual layer RL1 on the base substrate.

In some embodiments, the first residual layer RL1 is on the second base substrate BS2. In one example, the first residual layer RL1 is in direct contact with the second base substrate BS2.

In some embodiments, the second residual layer RL2 is on a side of the first residual layer RL1 away from the second base substrate BS2, and the second residual encapsulating layer REN2 is on a side of the second residual layer RL2 away from the first residual layer RL1. In one example, the second residual layer RL2 is in direct contact with the first residual layer RL1, and the second residual encapsulating layer REN2 is in direct contact with the second residual layer RL2.

In some embodiments, an orthographic projection of the second residual encapsulating layer REN2 on a base substrate covers an orthographic projection of the first residual layer RL1 on the base substrate. Optionally, in a cross-section along a plane perpendicular to a surface of the second base substrate BS2 and intersecting the respective encapsulated unit REU, the first residual encapsulating layer REN1, and the second light emitting element substrate LS2 (e.g., the cross-section shown in FIG. 26), the second residual encapsulating layer REN2 has a width greater than a width of the first residual layer RL1, e.g., by at least 10%, by at least 15%, by at least 20%, by at least 25%, by at least 30%, by at least 35%, by at least 40%, by at least 45%, by at least 50%, by at least 55%, or by at least 60%.

In some embodiments, an orthographic projection of the second residual layer RL2 on a base substrate covers an orthographic projection of the first residual layer RL1 on the base substrate. Optionally, in a cross-section along a plane perpendicular to a surface of the second base substrate BS2 and intersecting the respective encapsulated unit REU, the first residual encapsulating layer REN1, and the second light emitting element substrate LS2 (e.g., the cross-section shown in FIG. 26), the second residual layer RL2 has a width greater than a width of the first residual layer RL1, e.g., by at least 10%, by at least 15%, by at least 20%, by at least 25%, by at least 30%, by at least 35%, by at least 40%, by at least 45%, by at least 50%, by at least 55%, or by at least 60%.

In some embodiments, an orthographic projection of the second residual encapsulating layer REN2 on a base substrate at least partially overlaps with an orthographic projection of the second residual layer RL2 on the base substrate. Optionally, in a cross-section along a plane perpendicular to a surface of the second base substrate BS2 and intersecting the respective encapsulated unit REU, the first residual encapsulating layer REN1, and the second light emitting element substrate LS2 (e.g., the cross-section shown in FIG. 26), the second residual encapsulating layer REN2 has a width substantially the same as a width of the second residual layer RL2.

In another aspect, the present disclosure provides a display panel. The display panel in some embodiment is fabricated by mass transferring a plurality of second intermediate substrates (e.g., the substrate depicted in FIG. 19 or FIG. 26) onto a transistor substrate.

Figure 35:
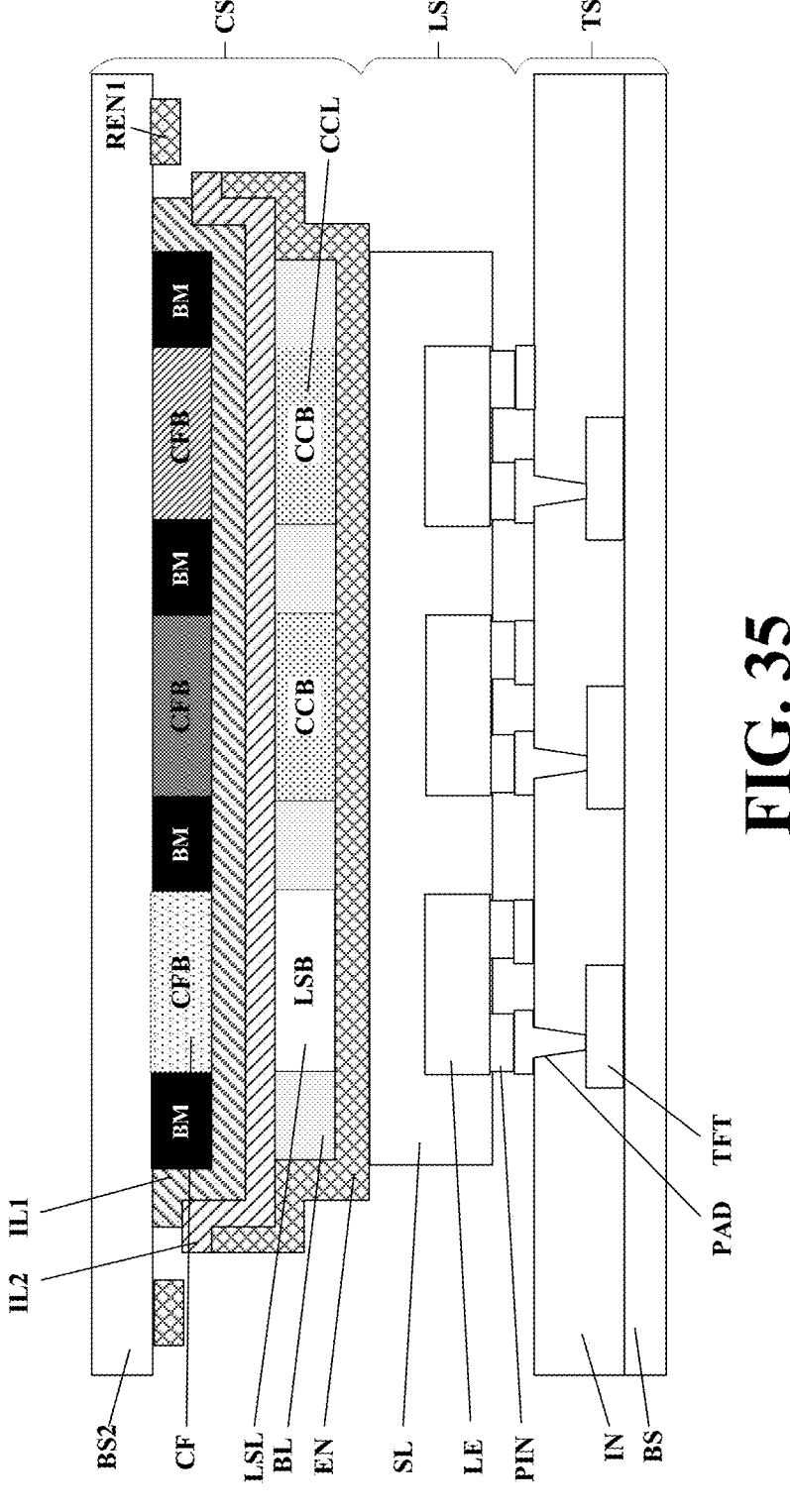
FIG. 35 is a schematic diagram illustrating the structure of a portion of a display panel in some embodiments according to the present disclosure.

FIG. 35 is a schematic diagram illustrating the structure of a portion of a display panel in some embodiments according to the present disclosure. FIG. 35 illustrates a display panel having a second color conversion substrate CS2 and a second light emitting element substrate LS2 depicted in FIG. 19 transferred onto a transistor substrate TS.

Figure 36:
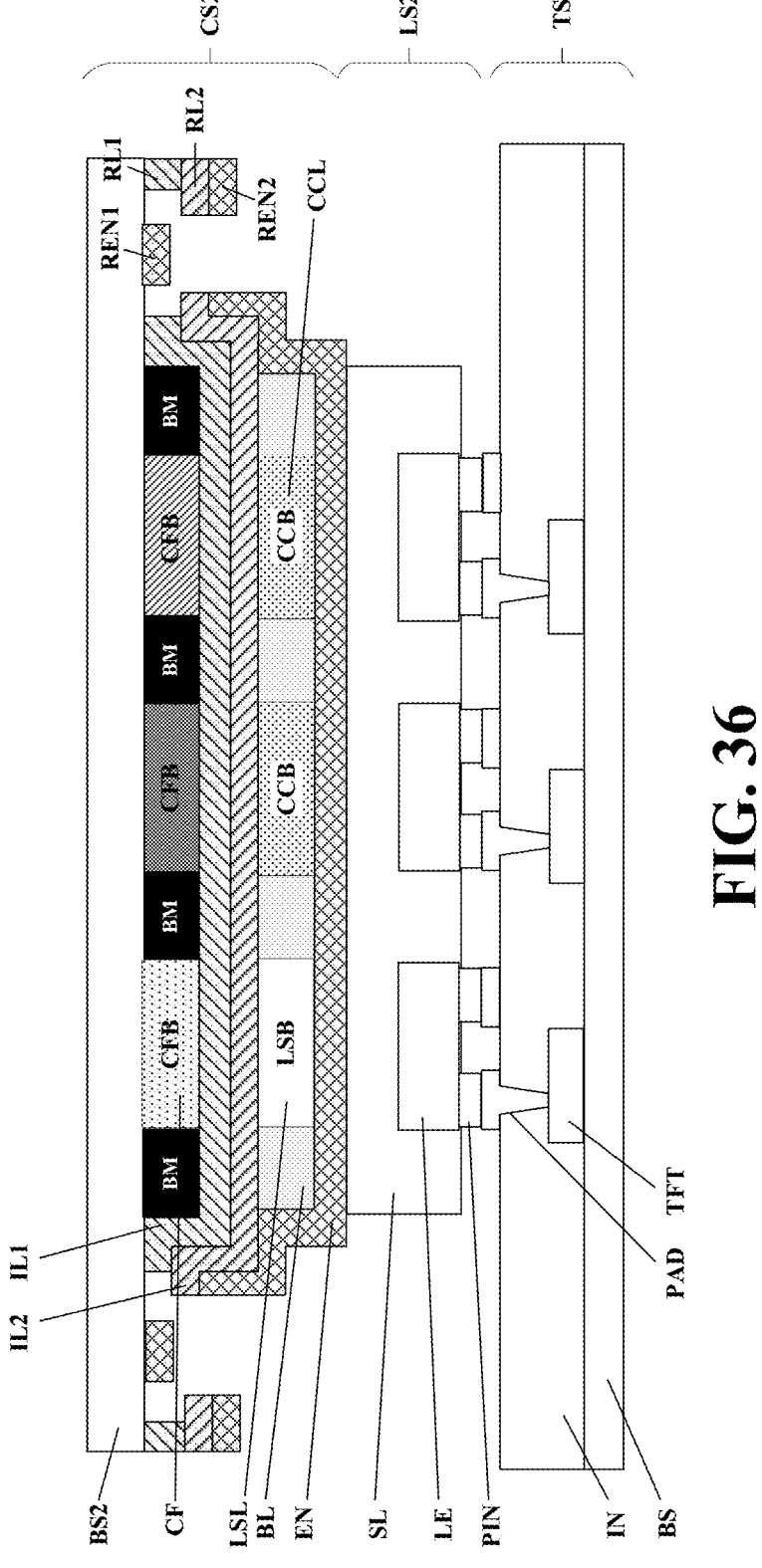
FIG. 36 is a schematic diagram illustrating the structure of a portion of a display panel in some embodiments according to the present disclosure.

FIG. 36 is a schematic diagram illustrating the structure of a portion of a display panel in some embodiments according to the present disclosure. FIG. 36 illustrates a display panel having a second color conversion substrate CS2 and a second light emitting element substrate LS2 depicted in FIG. 26 transferred onto a transistor substrate TS.

In some embodiments, the transistor substrate TS includes a base substrate BS, a plurality of thin film transistors TFT on the base substrate BS, an insulating layer IN on a side of the plurality of thin film transistors TFT away from the base substrate BS, and a plurality of contract pads PAD on a side of the insulating layer IN away from the base substrate BS. Optionally, the insulating layer IN is a resin layer. At least one contact pad of the plurality of contact pads PAD is electrically connected to a thin film transistor of the plurality of thin film transistors TFT though the insulating layer IN.

In some embodiments, the second light emitting element substrate LS2 includes a plurality of contact pins PIN and a plurality of light emitting elements LE. In the second light emitting element substrate LS2, a respective light emitting element of the plurality of light emitting elements LE is electrically connected to at least one of the plurality of contact pads PAD. In the display panel, a respective contact pin of the plurality of contact pins PIN is electrically connected to an individual contact pad of the plurality of contact pads PAD.

Figure 37:
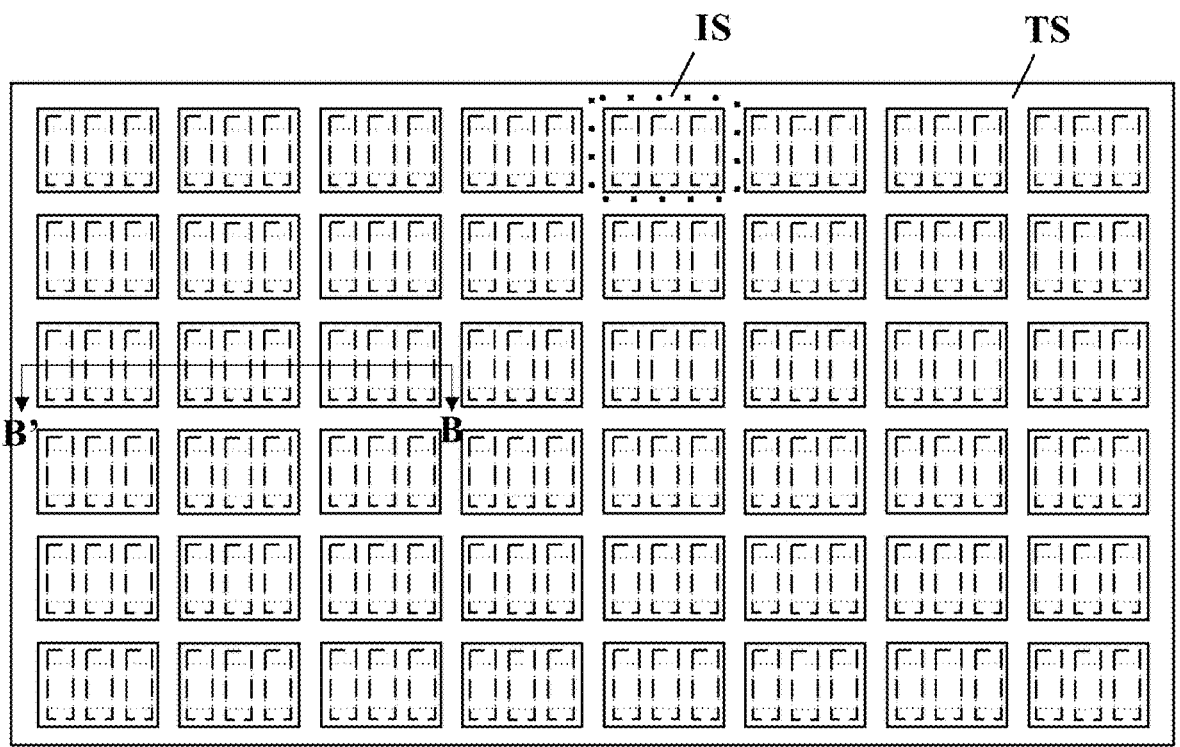
FIG. 37 is a schematic diagram illustrating the structure of a display panel in some embodiments according to the present disclosure.
Figure 38:
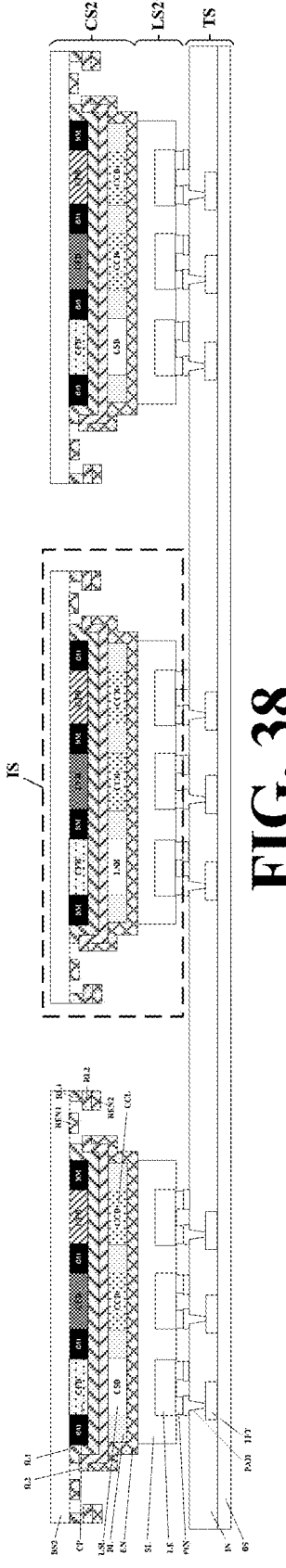
FIG. 38 is a cross-sectional view along a B-B' line in FIG. 37.

FIG. 37 is a schematic diagram illustrating the structure of a display panel in some embodiments according to the present disclosure. FIG. 38 is a cross-sectional view along a B-B' line in FIG. 37. Referring to FIG. 37 and FIG. 38, the display panel includes a transistor substrate TS and a plurality of islands IS on the transistor substrate TS. Optionally, the transistor substrate is a unitary transistor substrate extending throughout a region having the plurality of islands IS.

In some embodiments, the transistor substrate TS includes a base substrate BS, a plurality of thin film transistors TFT on the base substrate BS, an insulating layer IN on a side of the plurality of thin film transistors TFT away from the base substrate BS, and a plurality of contract pads PAD on a side of the insulating layer IN away from the base substrate BS. Optionally, the insulating layer IN is a resin layer. At least one contact pad of the plurality of contact pads PAD is electrically connected to a thin film transistor of the plurality of thin film transistors TFT though the insulating layer IN.

In some embodiments, a respective island of the plurality of islands IS includes a plurality of contact pins PIN and a plurality of light emitting elements LE. In the respective island, a respective light emitting element of the plurality of light emitting elements LE is electrically connected to at least one of the plurality of contact pads PAD. A respective contact pin of the plurality of contact pins PIN is electrically connected to an individual contact pad of the plurality of contact pads PAD.

In some embodiments, the respective island includes a second color conversion substrate CS2 and a second light emitting element substrate LS2 assembled together. The second light emitting element substrate LS2 includes the plurality of contact pins PIN and the plurality of light emitting elements LE discussed above.

In some embodiments, the second light emitting element substrate LS2 further includes a sealant layer SL on a side of the plurality of light emitting elements LE away from the plurality of contact pins PIN. In the respective island, the sealant layer SL attaches the second light emitting element substrate LS2 and the second color conversion substrate CS2 together.

In some embodiments, the respective island includes a respective encapsulated unit REU. The structure of the respective encapsulated unit REU in the respective island is described in FIG. 19 to FIG. 34, and associated texts. Various alternative implementations of the encapsulated unit may be practiced in the present disclosure.

In some embodiments, at least one island of the plurality of islands IS includes a separation structure substantially surrounding the respective encapsulated unit REU. The structure of the separation structure may be one described in FIG. 19 to FIG. 24, FIG. 35, and associated texts; or may be one described in FIG. 26 to FIG. 34, FIG. 36, and associated texts. Various alternative implementations of the separation structure may be practiced in the present disclosure.

In another aspect, the present disclosure provides a display apparatus, including the display panel described herein or fabricated by a method described herein, and one or more integrated circuits connected to the display panel. Examples of appropriate display apparatuses include, but are not limited to, an electronic paper, a mobile phone, a tablet computer, a television, a monitor, a notebook computer, a digital album, a GPS, etc.

In another aspect, the present disclosure provides a method of fabricating a display panel. In some embodiments, the method includes forming a respective encapsulated unit and forming a separation structure substantially surrounding the respective encapsulated unit. Optionally, forming the respective encapsulated unit includes forming a color conversion layer comprising one or more color conversion blocks; and forming a respective encapsulating block in an encapsulating layer encapsulating the one or more color conversion blocks. Optionally, the encapsulating layer is at least partially absent in a peripheral region around the respective encapsulated unit.

In some embodiments, the method includes forming a first inter material layer on a second base substrate; forming a second inter material layer on a side of the first inter material layer away from the second base substrate, wherein the first inter layer and the second inter layer comprise insulating materials of different etch selectivity; forming a photoresist layer on a side of the second inter material layer away from the first inter material layer; and etching the first inter material layer and the second inter material layer using an etchant, thereby forming a stacked structure, a first inter layer, and a second inter layer. Optionally, the stacked structure includes a first residual layer; and a second residual layer on a side of the first residual layer away from a second base substrate.

In some embodiments, the method further includes depositing an encapsulating material on a side of the second residual layer and the second inter layer away from the second base substrate. Optionally, the encapsulating material deposited on the substrate is segregated into at least an encapsulating layer, a first residual encapsulating layer, and a second residual encapsulating layer.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A display substrate, comprising a respective encapsulated unit and a separation structure substantially surrounding the respective encapsulated unit;

wherein the respective encapsulated unit comprises:

a color conversion layer comprising one or more color conversion blocks;

a respective encapsulating block in an encapsulating layer encapsulating the one or more color conversion blocks; and a base substrate on a side of the color conversion layer away from the respective encapsulating block, and on a side of the color conversion layer away from the encapsulating layer;

wherein the encapsulating layer is at least partially absent in a peripheral region around the respective encapsulated unit; and the color conversion layer is on a side of the base substrate closer to the encapsulating layer, and on a side of the encapsulating layer closer to the base substrate;

wherein the display substrate further comprises a plurality of light emitting elements on a side of the encapsulating layer away from the base substrate;

wherein the separation structure comprises a first residual encapsulating layer comprising a ring substantially surrounding the respective encapsulated unit; and the first residual encapsulating layer is at least partially absent in the peripheral region around the respective encapsulated unit.

2. The display substrate of claim 1, wherein the base substrate is at least partially uncovered.

3. The display substrate of claim 1, wherein the respective encapsulated unit further comprises:

a respective first inter layer block in a first inter layer on the base substrate; and a respective second inter layer block in a second inter layer on a side of the first inter layer away from the base substrate.

4. The display substrate of claim 3, wherein the first inter layer and the second inter layer comprise insulating materials of different etch selectivity; and the first inter layer comprises a material having a higher etch selectivity with respect to a material of the second inter layer.

5. The display substrate of claim 4, wherein each of the first inter layer and the second inter layer is at least partially absent in the peripheral region around the respective encapsulated unit.

6. The display substrate of claim 1, wherein the first residual encapsulating layer and the encapsulating layer are in a same layer.

7. The display substrate of claim 1, wherein the separation structure further comprises a stacked structure on a side of the ring of the first residual encapsulating layer away from the respective encapsulated unit; and the stacked structure substantially surrounds the ring of the first residual encapsulating layer.

8. The display substrate of claim 7, wherein the stacked structure comprises:

a first residual layer; and a second residual layer on a side of the first residual layer away from the base substrate.

9. The display substrate of claim 8, wherein an orthographic projection of the second residual encapsulating layer on the base substrate covers an orthographic projection of the first residual layer on the base substrate; and in a cross-section along a plane perpendicular to a surface of the base substrate and intersecting the respective encapsulated unit and the first residual encapsulating layer, the second residual layer has a width greater than a width of the first residual layer.

10. The display substrate of claim 8, wherein the stacked structure further comprises a second residual encapsulating layer on a side of the second residual layer away from the first residual layer; and the first residual encapsulating layer, the second residual encapsulating layer, and the encapsulating layer are in a same layer.

11. The display substrate of claim 10, wherein an orthographic projection of the second residual encapsulating layer on the base substrate covers an orthographic projection of the first residual layer on the base substrate; and in a cross-section along a plane perpendicular to a surface of the base substrate and intersecting the respective encapsulated unit and the first residual encapsulating layer, the second residual encapsulating layer has a width greater than a width of the first residual layer.

12. The display substrate of claim 1, further comprising a light emitting element substrate comprising the plurality of light emitting elements and a sealant layer;

wherein the sealant layer attaches the light emitting element substrate and the respective encapsulated unit together.

13. A display panel, comprising the display substrate of claim 1, and a transistor substrate comprising a plurality of thin film transistors.

14. The display panel of claim 13, comprising a plurality of islands spaced apart from each other and on the transistor substrate;

wherein a respective island of the plurality of islands comprises the respective encapsulated unit.

15. The display panel of claim 14, wherein the respective island further comprises a plurality of contact pins and the plurality of light emitting elements;

a respective light emitting element of the plurality of light emitting elements is electrically connected to at least one of the plurality of contact pads;

the transistor substrate comprises a plurality of thin film transistors and a plurality of contract pads;

at least one contact pad of the plurality of contact pads is electrically connected to a thin film transistor of the plurality of thin film transistors; and a respective contact pin of the plurality of contact pins is electrically connected to an individual contact pad of the plurality of contact pads.

16. A display apparatus, comprising the display panel of claim 13, and one or more integrated circuits connected to the display panel.

17. A method of fabricating a display substrate, comprising forming a respective encapsulated unit and forming a separation structure substantially surrounding the respective encapsulated unit;

wherein forming the respective encapsulated unit comprises:

forming a color conversion layer comprising one or more color conversion blocks;

forming a respective encapsulating block in an encapsulating layer encapsulating the one or more color conversion blocks; and forming a base substrate on a side of the color conversion layer away from the respective encapsulating block, and on a side of the color conversion layer away from the encapsulating layer;

wherein the encapsulating layer is at least partially absent in a peripheral region around the respective encapsulated unit; and the color conversion layer is on a side of the base substrate closer to the encapsulating layer, and on a side of the encapsulating layer closer to the base substrate;

wherein the display substrate further comprises a plurality of light emitting elements on a side of the encapsulating layer away from the base substrate;

wherein the separation structure comprises a first residual encapsulating layer comprising a ring substantially surrounding the respective encapsulated unit;

the first residual encapsulating layer is at least partially absent in the peripheral region around the respective encapsulated unit; and the first residual encapsulating layer and the encapsulating layer are in a same layer.

18. The method of claim 17, comprising:

forming a first inter material layer on a base substrate;

forming a second inter material layer on a side of the first inter material layer away from the base substrate, wherein the first inter layer and the second inter layer comprise insulating materials of different etch selectivity;

forming a photoresist layer on a side of the second inter material layer away from the first inter material layer; and etching the first inter material layer and the second inter material layer using an etchant, thereby forming a stacked structure, a first inter layer, and a second inter layer;

wherein the stacked structure comprises:

a first residual layer; and a second residual layer on a side of the first residual layer away from the base substrate.

19. A display substrate, comprising a respective encapsulated unit and a separation structure substantially surrounding the respective encapsulated unit;

wherein the separation structure comprises a stacked structure having a first residual layer and a second residual layer stacked on each other;

an orthographic projection of the second residual encapsulating layer on a base substrate covers an orthographic projection of the first residual layer on the base substrate;

in a cross-section along a plane perpendicular to a surface of the base substrate and intersecting the respective encapsulated unit, the first residual layer, and the second residual layer, the second residual layer has a width greater than a width of the first residual layer; and the second residual layer is on a side of the first residual layer away from the base substrate;

wherein the respective encapsulated unit comprises:

a color conversion layer comprising one or more color conversion blocks; and a respective encapsulating block in an encapsulating layer encapsulating the one or more color conversion blocks;

wherein the encapsulating layer is at least partially absent in the peripheral region around the respective encapsulated unit;

wherein the color conversion substrate further comprises the base substrate on a side of the color conversion layer away from the respective encapsulating block; and the color conversion layer is on a side of the base substrate closer to the encapsulating layer, and on a side of the encapsulating layer closer to the base substrate;

wherein the display substrate further comprises a plurality of light emitting elements on a side of the encapsulating layer away from the base substrate.

20. The display substrate of claim 19, wherein the respective encapsulated unit further comprises:

a respective first inter layer block in a first inter layer on the base substrate; and a respective second inter layer block in a second inter layer on a side of the first inter layer away from the base substrate;

wherein the first residual layer and the first inter layer are in a same layer; and the second residual layer and the second inter layer are in a same layer;

wherein the encapsulating layer is in a same layer as a first residual encapsulating layer and a second residual encapsulating layer.

\* \* \* \* \*